United States Patent
Chen et al.

(10) Patent No.: US 11,621,342 B2
(45) Date of Patent: Apr. 4, 2023

(54) SEMICONDUCTOR DEVICE, METHOD, AND TOOL OF MANUFACTURE

(71) Applicant: Taiwan Semiconductor Manufacturing Co., Ltd., Hsinchu (TW)

(72) Inventors: Chih Hung Chen, Hsinchu (TW); Kei-Wei Chen, Tainan (TW); Ying-Lang Wang, Tien-Chung Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 261 days.

(21) Appl. No.: 17/068,578

(22) Filed: Oct. 12, 2020

(65) Prior Publication Data

US 2021/0036129 A1 Feb. 4, 2021

Related U.S. Application Data

(62) Division of application No. 15/875,289, filed on Jan. 19, 2018, now Pat. No. 10,804,370.

(60) Provisional application No. 62/471,736, filed on Mar. 15, 2017.

(51) Int. Cl.
| H01L 29/66 | (2006.01) |
| H01L 29/40 | (2006.01) |
| H01L 21/67 | (2006.01) |
| H01L 21/321 | (2006.01) |
| B24B 37/00 | (2012.01) |
| B24B 37/10 | (2012.01) |
| B24B 7/22 | (2006.01) |
| H01L 29/08 | (2006.01) |

(52) U.S. Cl.
CPC ........ *H01L 29/66545* (2013.01); *B24B 7/228* (2013.01); *B24B 37/00* (2013.01); *B24B 37/107* (2013.01); *H01L 21/3212* (2013.01); *H01L 21/67063* (2013.01); *H01L 29/401* (2013.01); *H01L 29/6653* (2013.01); *H01L 29/6656* (2013.01); *H01L 29/66795* (2013.01); *H01L 21/321* (2013.01); *H01L 21/32105* (2013.01); *H01L 29/0847* (2013.01)

(58) Field of Classification Search
None
See application file for complete search history.

(56) References Cited

U.S. PATENT DOCUMENTS

| 5,750,440 | A | 5/1998 | Vanell et al. |
| 6,008,123 | A | 12/1999 | Kook et al. |
| 2002/0111026 | A1 | 8/2002 | Small et al. |
| 2003/0186497 | A1 | 10/2003 | Kondo et al. |
| 2006/0071275 | A1* | 4/2006 | Brask ................ H01L 29/66439 257/350 |
| 2008/0233749 | A1* | 9/2008 | Lu ....................... H01L 21/3212 438/692 |
| 2018/0130671 | A1 | 5/2018 | Duan et al. |

* cited by examiner

*Primary Examiner* — Bo B Jang
(74) *Attorney, Agent, or Firm* — Slater Matsil, LLP

(57) ABSTRACT

In an embodiment, a method includes: performing a self-limiting process to modify a top surface of a wafer; after the self-limiting process completes, removing the modified top surface from the wafer; and repeating the performing the self-limiting process and the removing the modified top surface from the wafer until a thickness of the wafer is decreased to a predetermined thickness.

20 Claims, 22 Drawing Sheets

SEMICONDUCTOR DEVICE, METHOD, AND TOOL OF MANUFACTURE

PRIORITY CLAIM AND CROSS-REFERENCE

This application is a division of U.S. patent application Ser. No. 15/875,289 filed on Jan. 19, 2018, and entitled "Semiconductor Device, Method, and Tool of Manufacture," which claims the benefit of U.S. Provisional Application No. 62/471,736, filed on Mar. 15, 2017, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
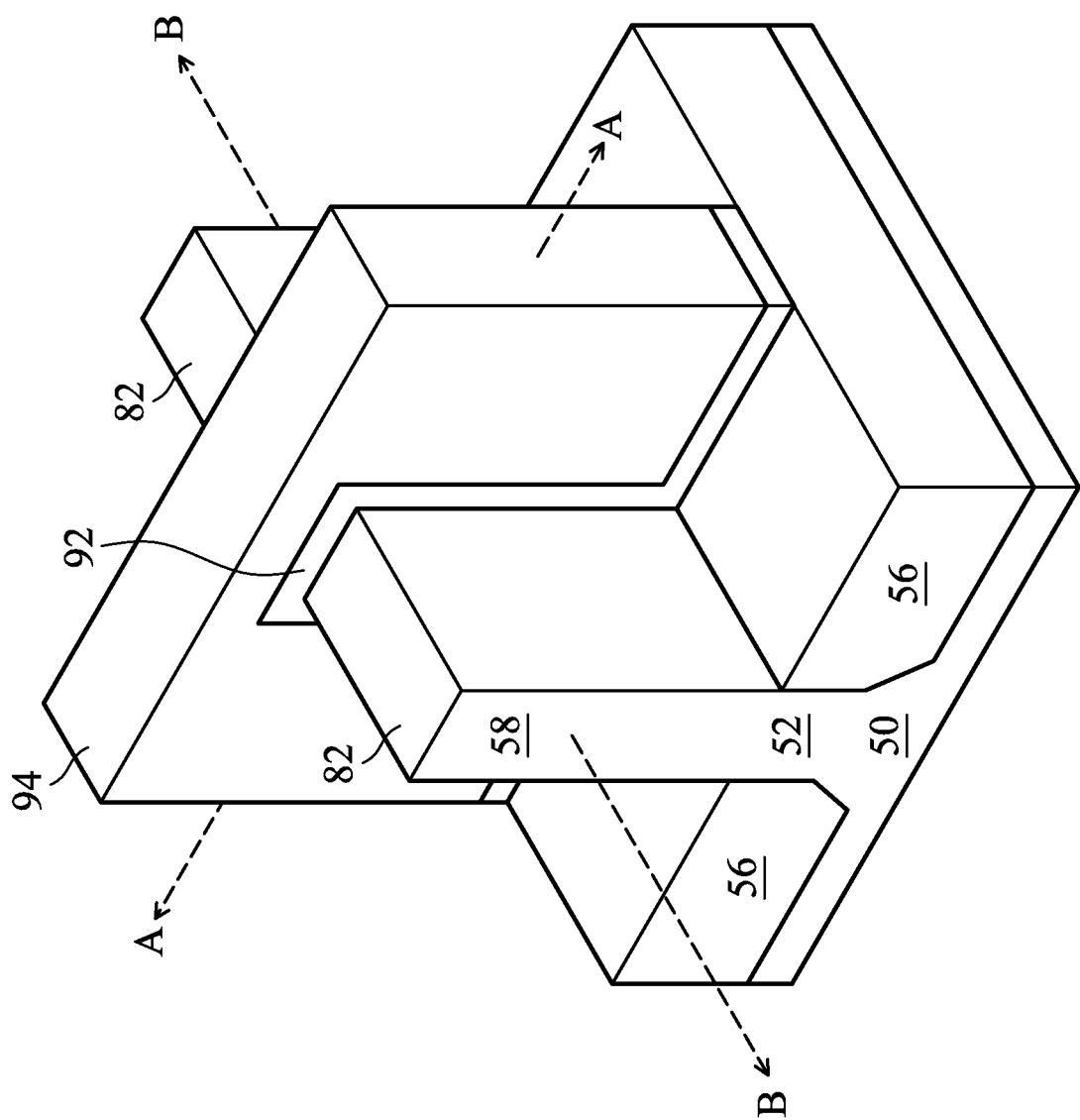
FIG. 1 illustrates an example of a FinFET in a three-dimensional view, according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices, methods, and tools of manufacture are described in accordance with various embodiments. In particular, a wafer having a semiconductor substrate thereon is placed in a planarization chamber. In the planarization chamber, a self-limiting process is performed in a first step to convert a top surface of the wafer to form a layer or film of a predetermined thickness. The layer or film has a chemical-mechanical planarization (CMP) removal rate several orders of magnitude larger than the CMP removal rate of the underlying portions of the wafer, and may be referred to as a modified surface layer. The modified surface layer may be a very thin layer, and in some embodiments may have or approach a thickness of a monolayer. As such, embodiment planarization techniques may be referred to herein as atomic layer removal (ALR). A removal process is then performed in a second step to remove the formed layer or film.

In some embodiments, the self-limiting process used to form the modified surface layer is a chemically driven oxidation process that weakens the surface layer. The oxidation process converts a surface of the wafer to an oxide layer or film. The oxidation process may be performed until saturation of the oxidation of the surface of the wafer, e.g., until the thickness substantially stops increasing. The thickness of the oxide layer is self-limiting by nature of the oxidation process; in other words, the oxidation process is self-limiting such that the oxidation rate of the wafer surface saturates, e.g., slows substantially or stops on its own. Once saturation occurs, the oxidation process is slowed or stopped. Selecting the parameters of the oxidation process, such as the oxidation reactants, may allow the saturation point (and thus the thickness of the oxidized layer) to be controlled. In an embodiment, the chemically driven oxidation process includes dispensing the oxidation reactants in a liquid form, e.g., as an oxidation solution. For example, the oxidation solution may be dispensed on the wafer using the same slurry dispenser that is used to dispense slurry during the removal process of the CMP. In some embodiments, the self-limiting process includes chemically bonding the surface layer of the wafer to molecules introduced to the wafer surface. The chemical bonding process is self-limiting, and ends when all or a substantial portion of the surface bonds of the wafer are occupied. A wide variety of bonding chemicals, e.g., ligands, may be used. For example, in some embodiments, the surface layer of the wafer may be a metal, and a chelator may be used to occupy the surface bonds of the wafer.

After the self-limiting process is performed to modify the surface layer of the wafer, the removal process is performed to remove the modified surface layer. In an embodiment, the removal process is a mechanical and/or chemical removal process. During removal, only the modified surface layer may be removed, and substantially no further material may be removed during the removal process. The surface layer is not further modified during the removal process, e.g., no further oxidation or chemical bonding occurs between the end of forming the modified surface layer and the end of the removal process. Likewise, no removal may be performed during the modification of the wafer surface. The CMP removal rate is limited by the thickness of the modified surface layer, which is self-limited by the oxidation or chemical bonding process. The self-limiting modification process and the removal process may be repeated until a desired amount of material has been removed from the surface of the wafer.

In accordance with some embodiments, a predefined thickness of material may be removed from the wafer by controlling parameters of the self-limited modification process, such as the oxide reactants, and not polishing the wafer until after the self-limited modification process has completed to saturation. As such, the time and material costs of some techniques used to rework variances of a CMP may be avoided. Finally, use of a planarization stop layer at the desired CMP stopping point may be avoided, further reducing costs.

FIG. 1 illustrates an example of a FinFET in a three-dimensional view, according to some embodiments. The FinFET comprises a fin 58 on a substrate 50. The substrate 50 includes isolation regions 56, and the fin 58 protrudes above and from between neighboring isolation regions 56. A gate dielectric layer 92 is along sidewalls and over a top surface of the fin 58, and a gate electrode 94 is over the gate dielectric layer 92. Source/drain regions 82 are disposed in opposite sides of the fin 58 with respect to the gate dielectric layer 92 and gate electrode 94. FIG. 1 further illustrates reference cross-sections that are used in later figures. Cross-section A-A is across a channel, gate dielectric layer 92, and gate electrode 94 of the FinFET. Cross-section B-B is perpendicular to cross-section A-A and is along a longitudinal axis of the fin 58 and in a direction of, for example, a current flow between the source/drain regions 82. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 18B are cross-sectional views of intermediate stages in the manufacturing of FinFETs, according to some embodiments. FIGS. 2 through 7 and 8C through 9 illustrate reference cross-section A-A illustrated in FIG. 1, except for multiple FinFETs. In FIGS. 10A through 18B, figures ending with an "A" designation are illustrated along reference cross-section A-A illustrated in FIG. 1, and figures ending with a "B" designation are illustrated along a similar cross-section B-B, except for multiple FinFETs.

Figure 2:
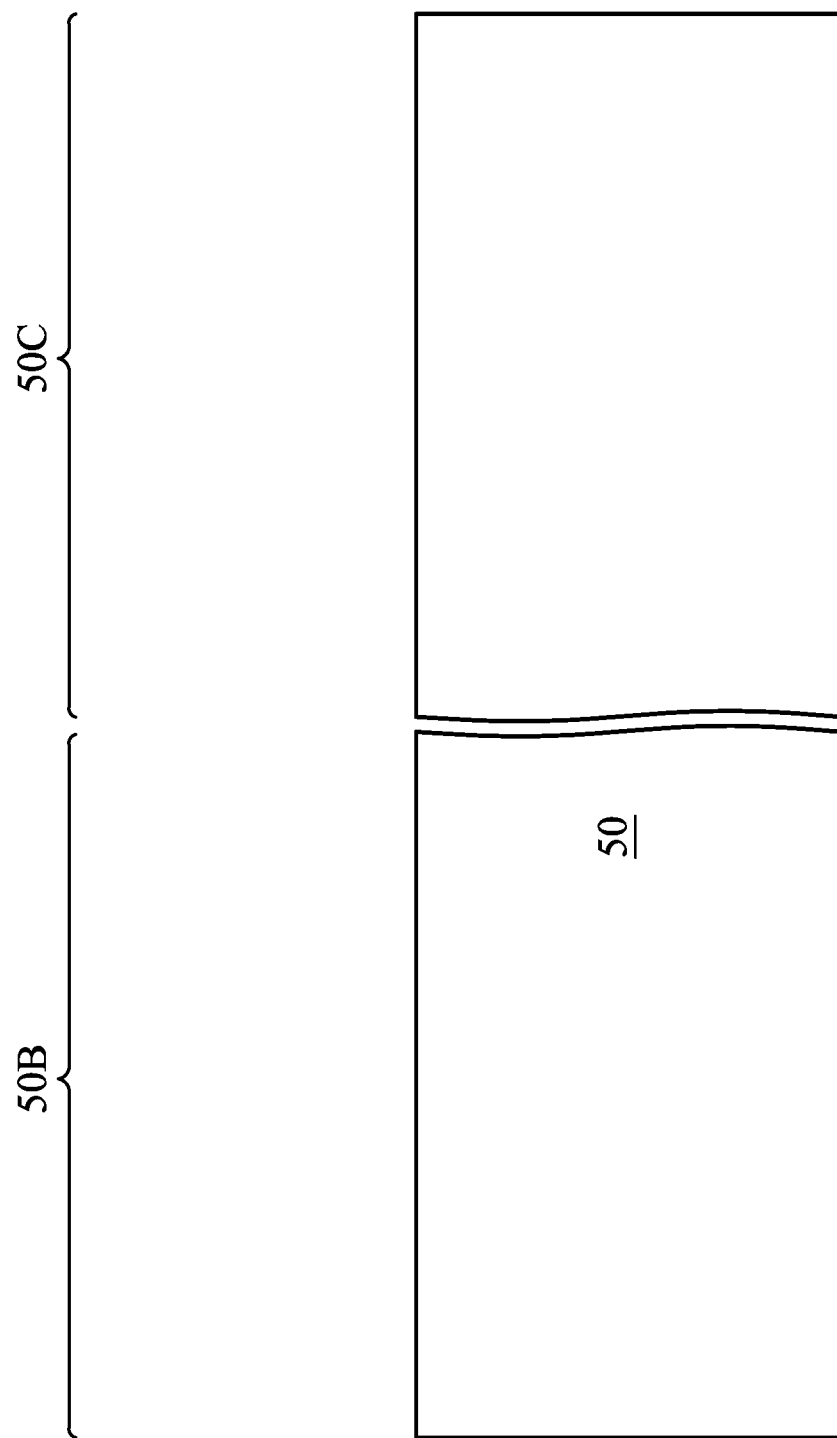
FIGS. 2, 3, 4, 5, 6, and 7 are cross-sectional views of intermediate stages in the manufacturing of FinFETs, according to some embodiments.

In FIG. 2, a substrate 50 is provided to form the wafers. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B can be for forming n-type devices, such as NMOS transistors, e.g., n-type FinFETs. The second region 50C can be for forming p-type devices, such as PMOS transistors, e.g., p-type FinFETs. In some embodiments, both the first region 50B and the second region 50C are used to form the same type of devices, such as both regions being for n-type devices or p-type devices.

Figure 3:
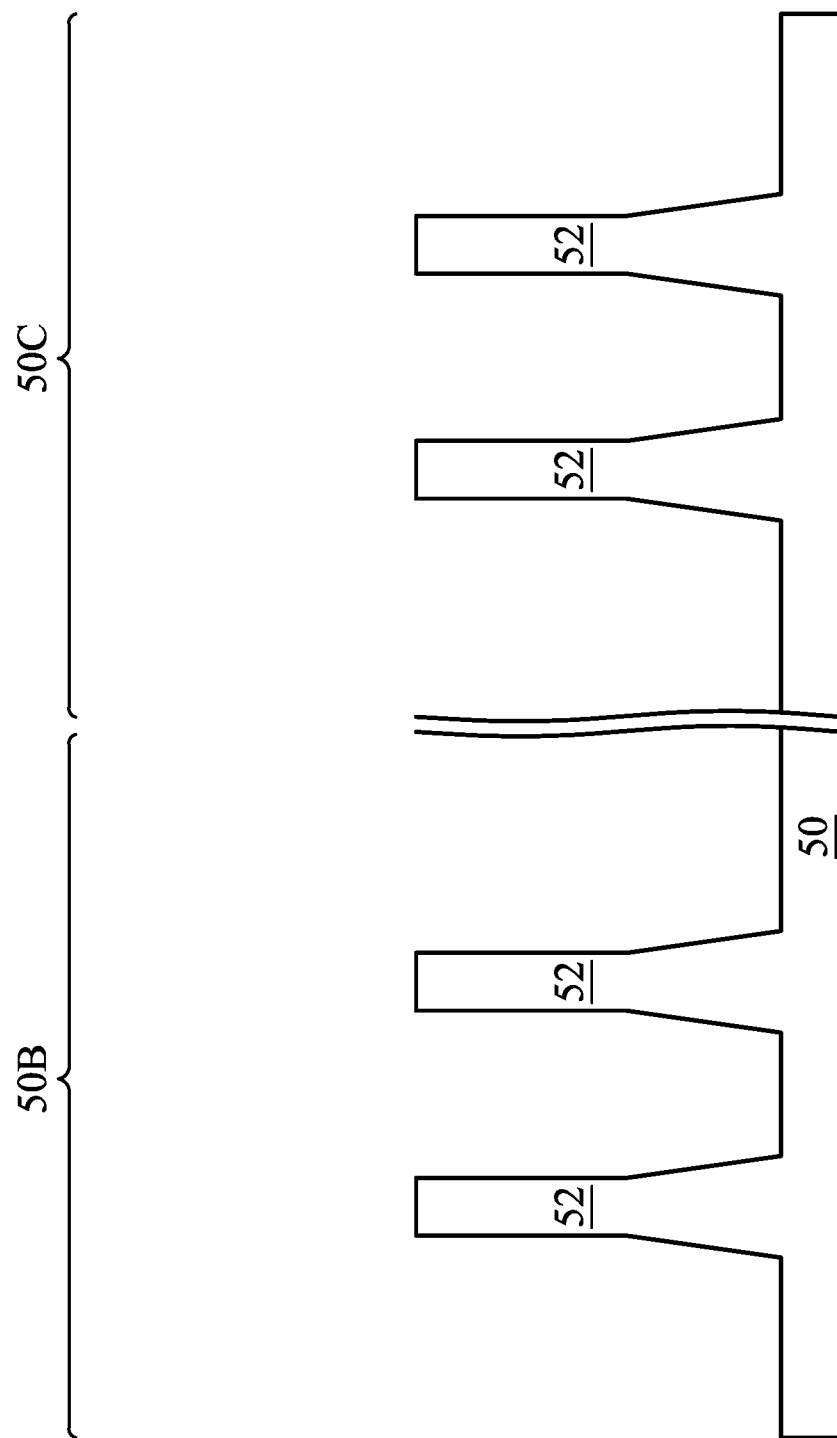

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

Figure 4:
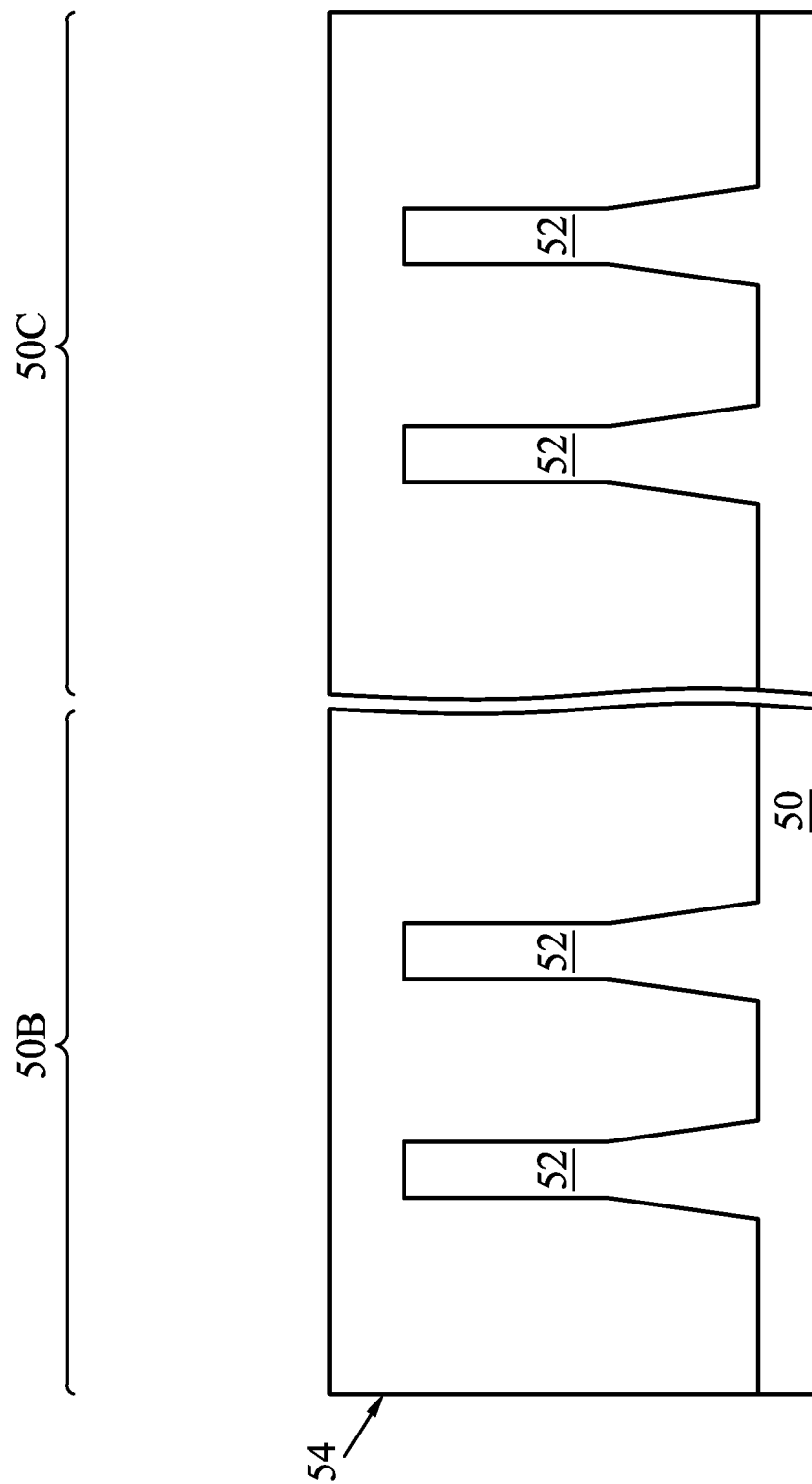

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52.

Figure 5:
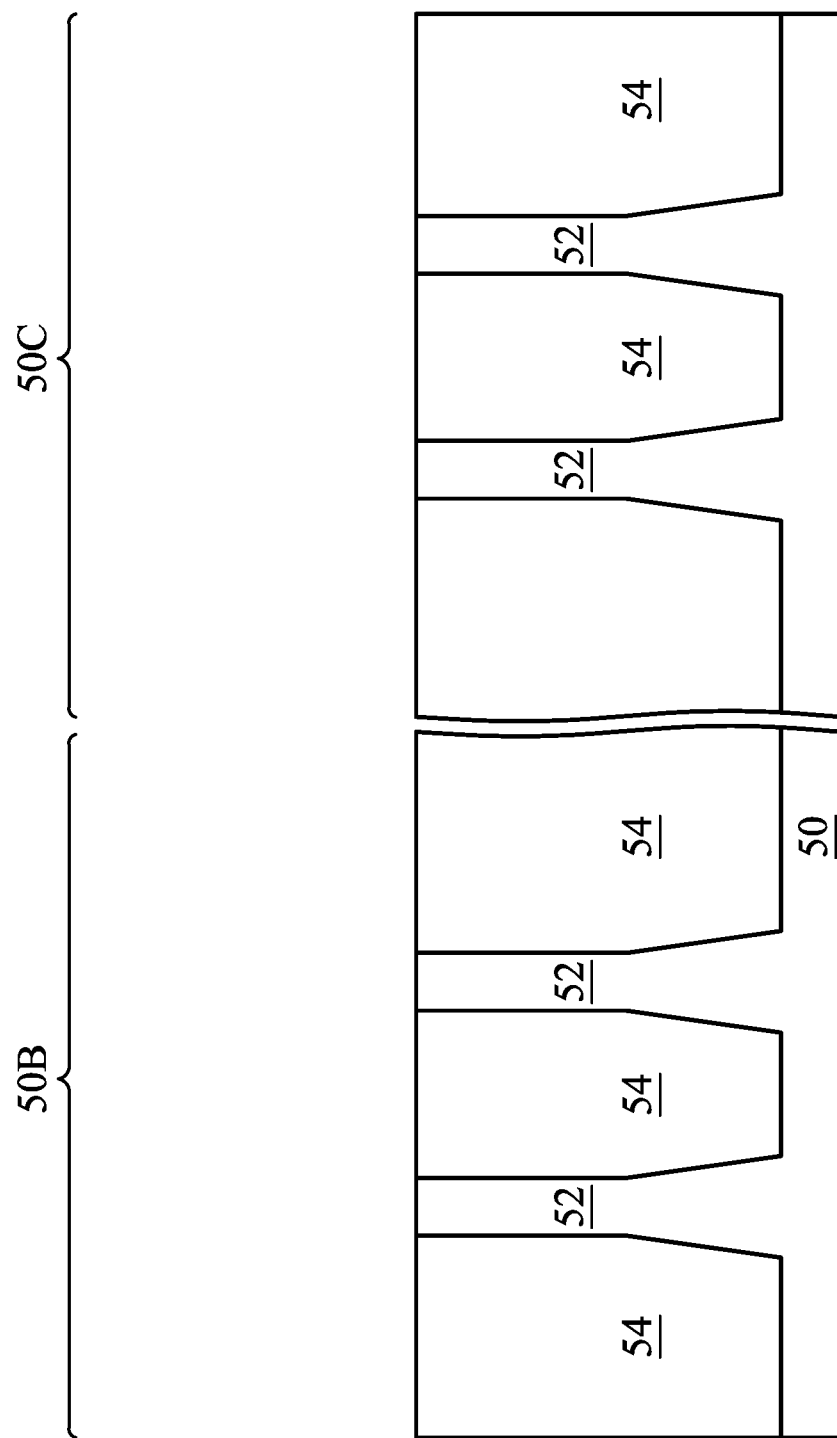

In FIG. 5, a planarization process is performed on the insulation material 54. The planarization process exposes the fins 52. Top surfaces of the fins 52 and the insulation material 54 are level after the planarization process is complete.

Figure 6:
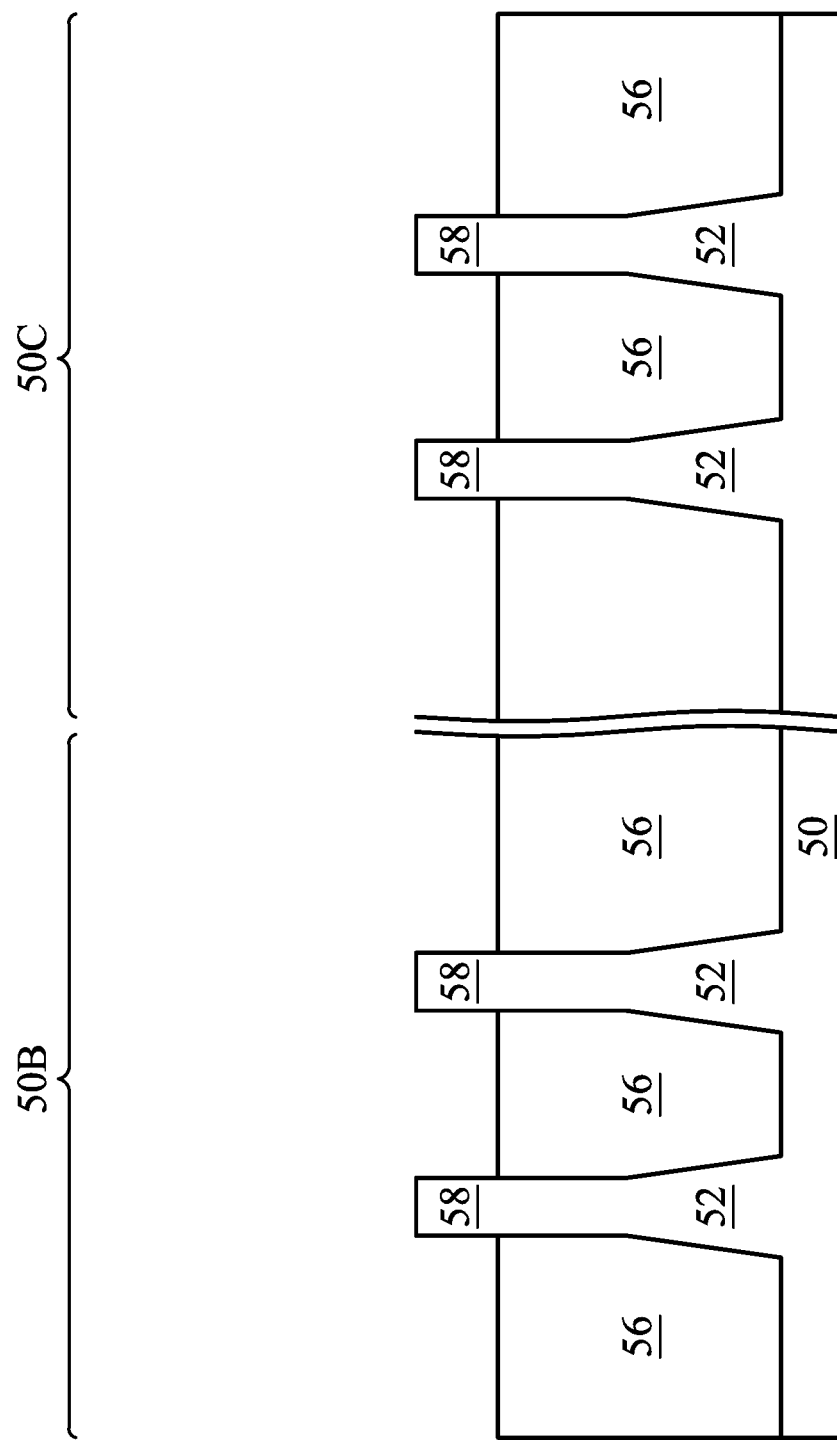

In FIG. 6, the insulation material 54 is recessed to form Shallow Trench Isolation (STI) regions 56. The insulation material 54 is recessed such that fins 58 in the first region 50B and in the second region 50C protrude from between neighboring STI regions 56. Further, the top surfaces of the STI regions 56 may have a flat surface as illustrated, a convex surface, a concave surface, or a combination thereof. The top surfaces of the STI regions 56 may be formed flat, convex, and/or concave by an appropriate etch. The STI regions 56 may be recessed using an acceptable etching process, such as one that is selective to the material of the insulation material 54.

Further in FIG. 6, appropriate wells (not shown) may be formed in the fins 58, the fins 52, and/or the substrate 50. In some embodiments, a P well may be formed in the first region 50B, and an N well may be formed in the second region 50C. In some embodiments, a P well or an N well are formed in both the first region 50B and the second region 50C. In the embodiments with different well types, the different implant steps for the first region 50B and the second region 50C may be achieved using a photoresist or other masks (not shown), where each region is masked while impurities are implanted in the other region. After the implants of the first region 50B and the second region 50C, an anneal may be performed to activate the p-type and/or n-type impurities that were implanted.

Figure 7:
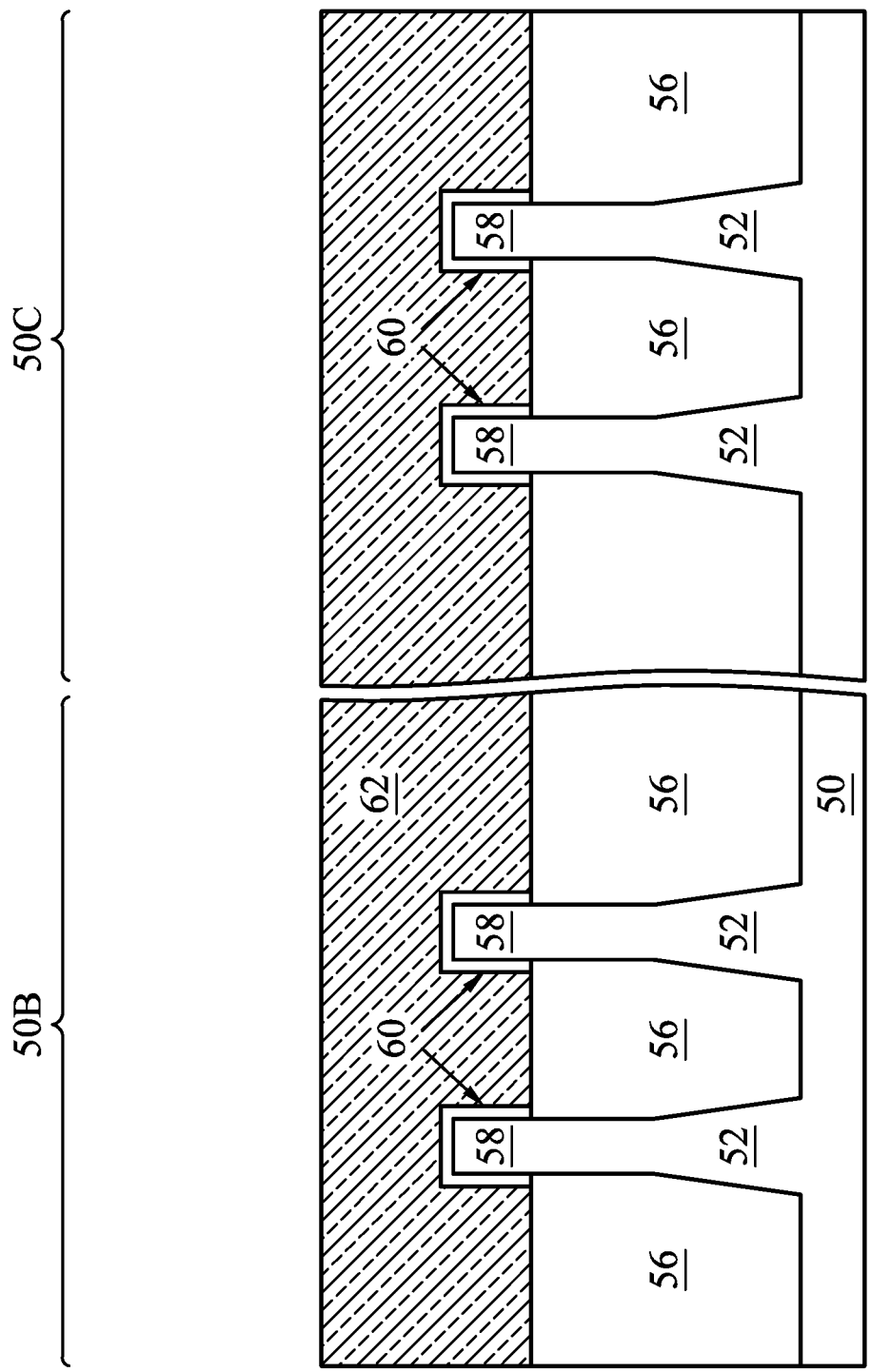

In FIG. 7, a dummy dielectric layer 60 is formed on the fins 58. Because various embodiments allow use of a planarization stop layer to be avoided, the dummy dielectric layer 60 may physically contact the fins 58. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The dummy gate layer 62 may be deposited over the dummy dielectric layer 60 and then planarized, such as by a CMP. In an embodiment, the planarization process used to planarize the dummy gate layer 62 is an ALR process performed using the planarization system 200.

Figure 8A:
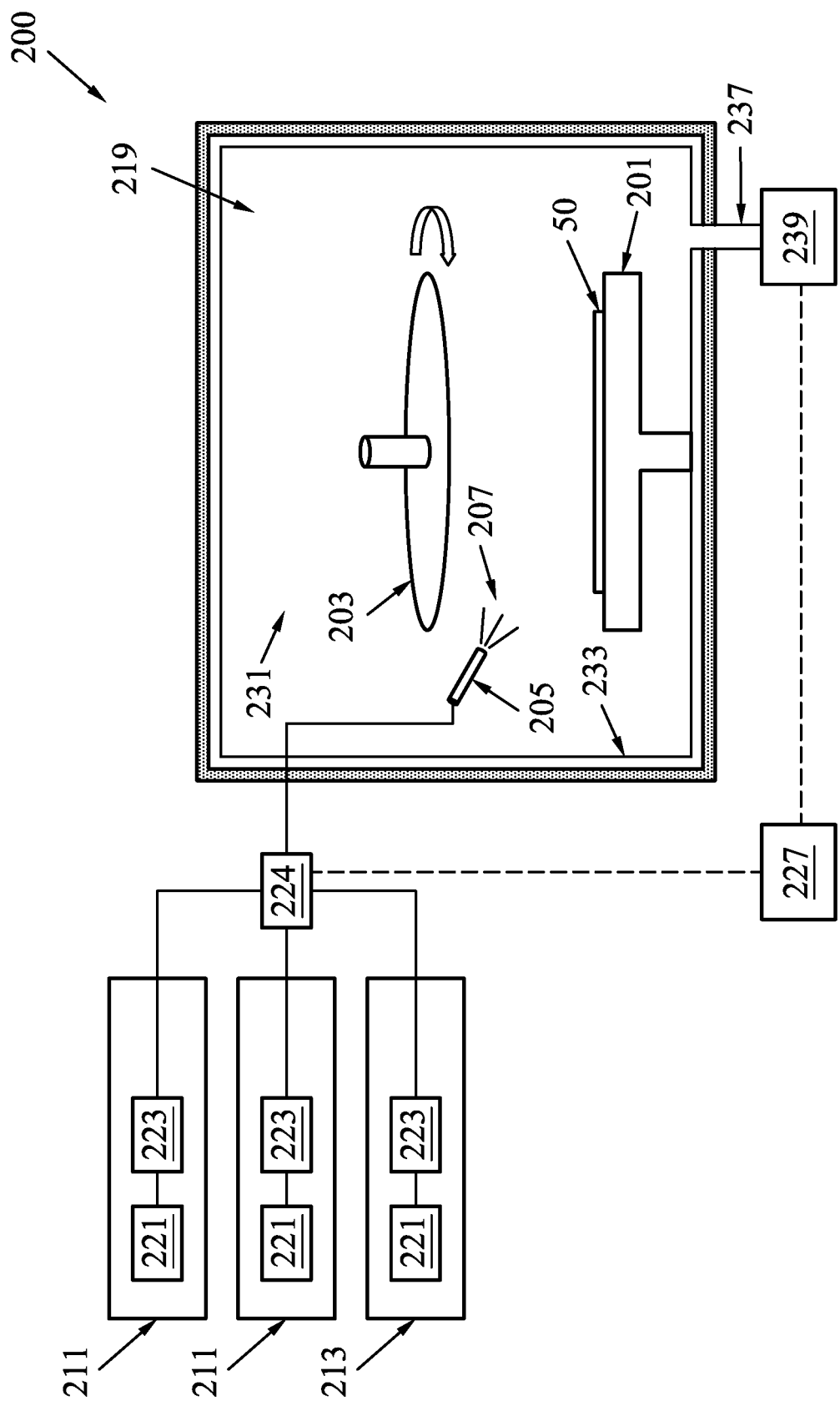
FIGS. 8A, 8B, 8C, and 8D illustrate aspects of a planarization system, according to some embodiments.
Figure 8B:
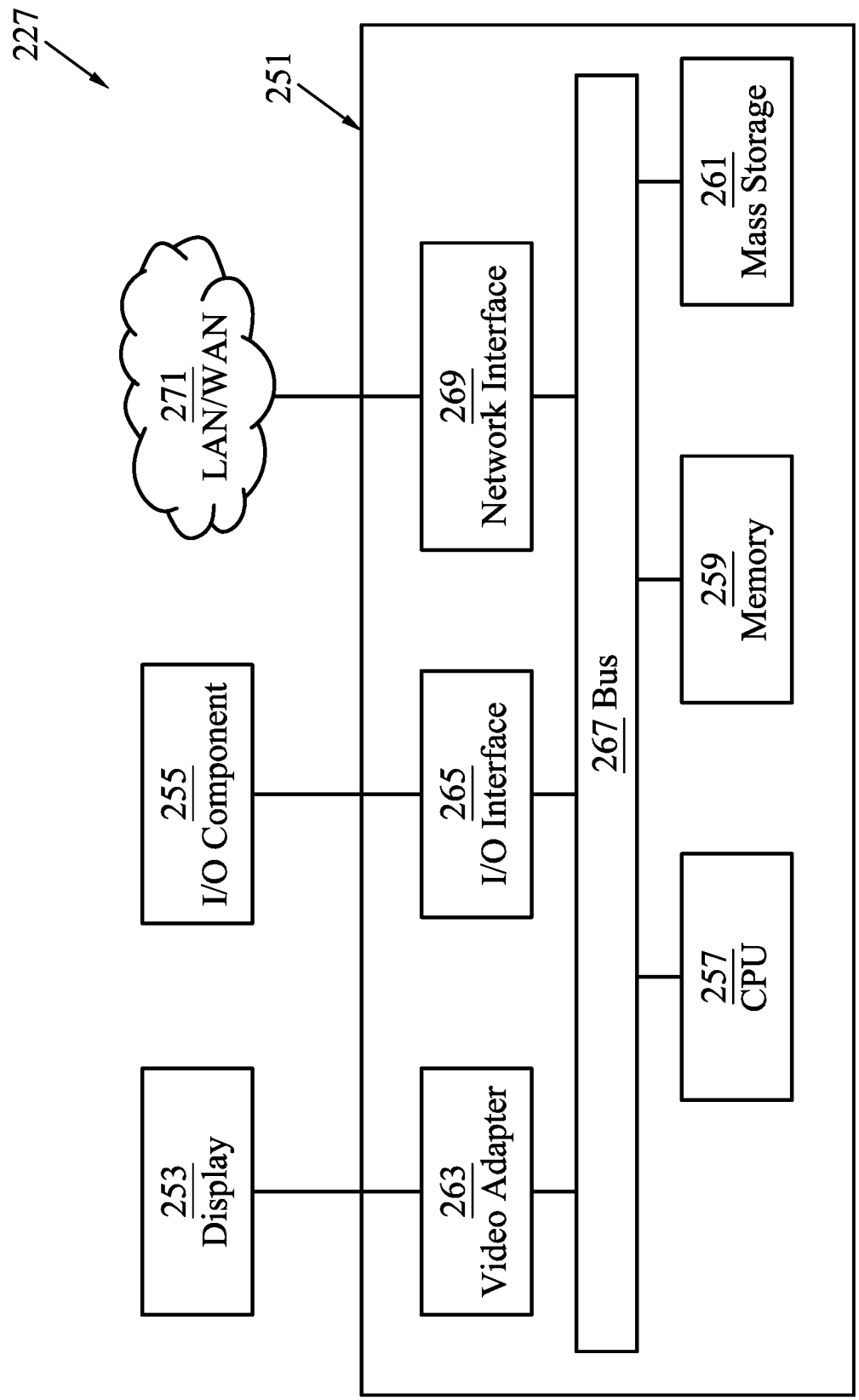
Figure 8C:
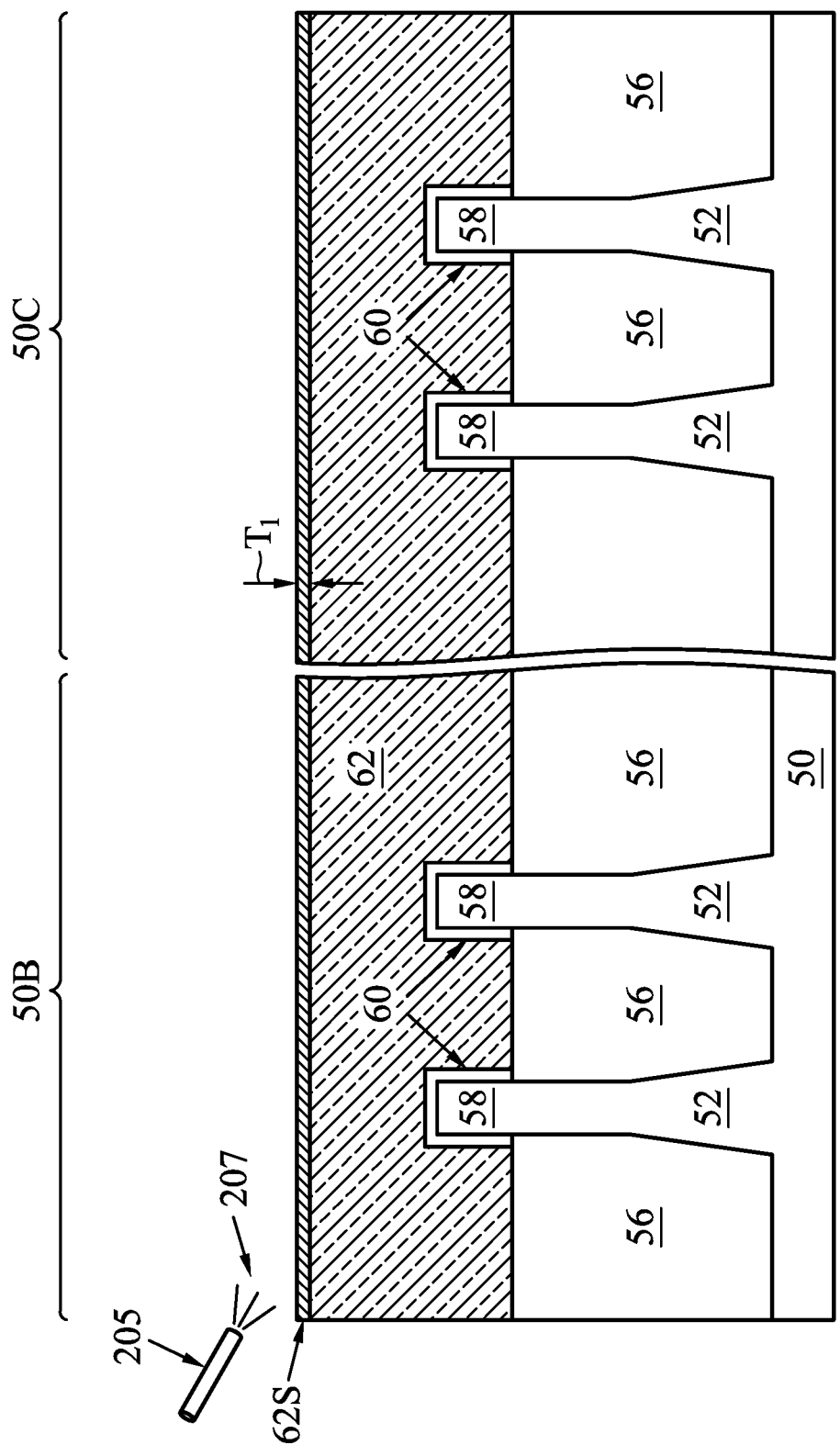
Figure 8D:
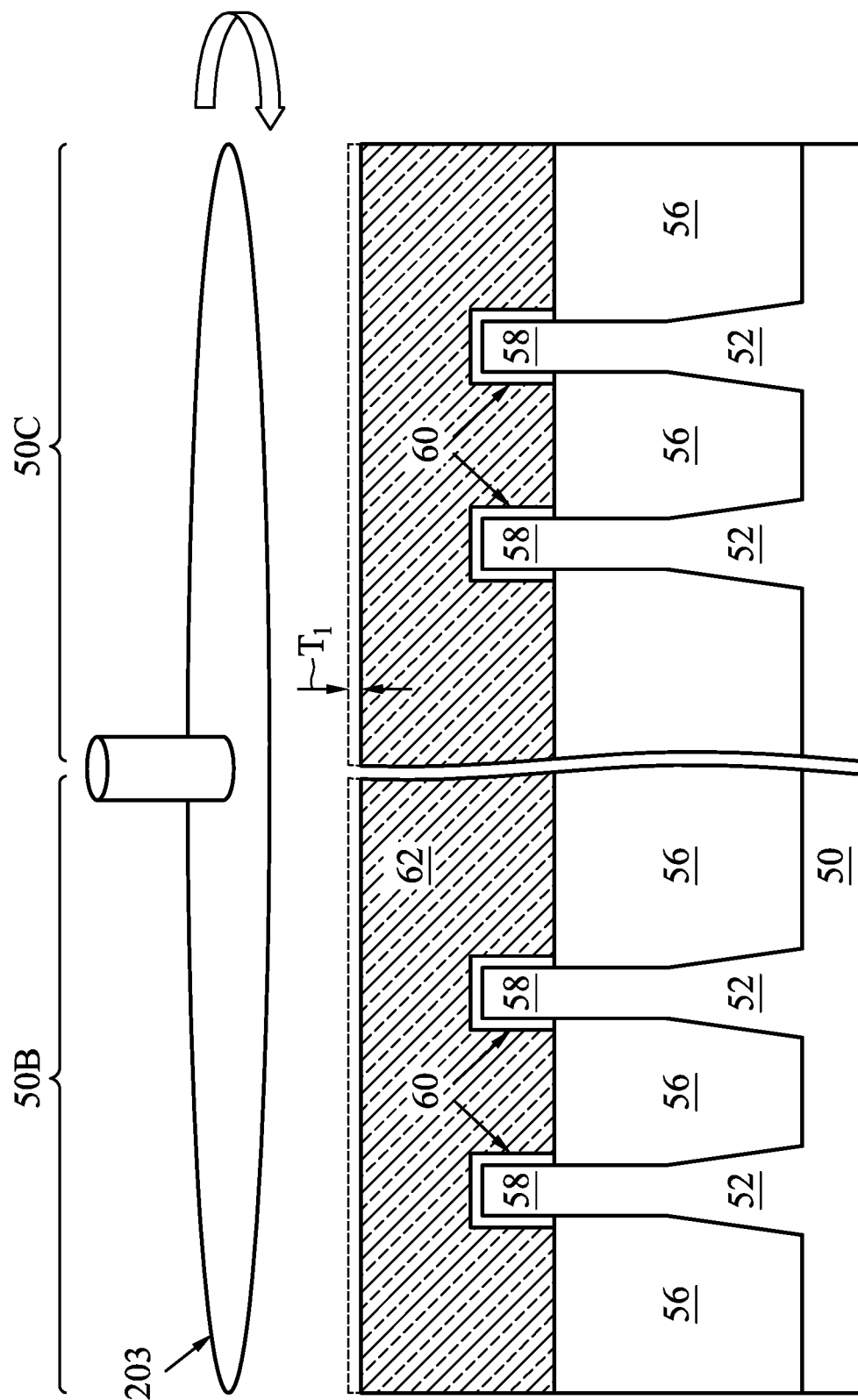

FIGS. 8A, 8B, 8C, and 8D illustrate a self-limiting planarization process which may be used to planarize the dummy gate layer 62. FIGS. 8A, 8B, 8C, and 8D illustrate planarization of the dummy gate layer 62 in a self-limiting planarization process using a planarization system 200, according to some embodiments. FIGS. 8A and 8B illustrate aspects of the planarization system 200. FIGS. 8C and 8D are cross-sectional views of intermediate stages in the manufacturing of the FinFETs using the planarization system 200. In FIG. 8C, a self-limiting process is performed to convert a top surface of the dummy gate layer 62 to a modified surface layer 62S. In FIG. 8D, a removal process is performed to remove the modified surface layer 62S from the dummy gate layer 62. This process is repeated until a predetermined quantity of material has been removed. In the embodiment shown in FIGS. 8A, 8B, 8C, and 8D, the self-limiting process is an oxidation process performed with an oxidation solution that forms the modified surface layer 62S by weakening the surface of the dummy gate layer 62. In other embodiments, a process for chemically bonding the surface layer of the wafer to ligands could be used to form the modified layer or film.

FIGS. 8A and 8B illustrate the planarization system 200. During operation, the substrate 50 is placed on a wafer carrier 201. The self-limiting process is performed to form the modified surface layer 62S in the top surface of the dummy gate layer 62. Once the modified surface layer 62S is formed, a platen 203 may be used to grind the substrate 50, thereby removing the modified surface layer 62S. During removal, a CMP slurry 207 may be dispensed through a slurry dispenser 205. The CMP slurry 207 may be a slurry that includes abrasives and/or etching chemicals, but does not include oxidizing chemicals. The platen 203 may include a polishing pad, and acts as a carrier for abrasives in the CMP slurry 207.

As part of the self-limiting process, the planarization system 200 receives the oxidation reactants from one or more oxidation reactant delivery systems 211. In an embodiment, the oxidation reactant delivery systems 211 may work in conjunction with one another to supply the various different oxidation reactants to form an oxidation solution that is dispensed in a planarization chamber 219, wherein the substrate 50 is placed on the wafer carrier 201. The oxidation reactant delivery systems 211 may each have physical components that are similar with each other.

The oxidation reactant delivery systems 211 may each include a chemical supply 221 and a flow controller 223. The chemical supply 221 of each oxidation reactant delivery system 211 may supply the respective oxidation reactant to form the oxidation solution that is dispensed in the planarization chamber 219. Each chemical supply 221 may be a vessel, such as a liquid or gas storage tank, that is located either locally to the planarization chamber 219 or else may be located remotely from the planarization chamber 219. Alternatively, each chemical supply 221 may be a facility that independently prepares and delivers the oxidation reactants to the flow controller 223. Any suitable source for the oxidation reactants may be utilized as the chemical supply 221, and all such sources are fully intended to be included within the scope of the embodiments. The flow controller 223 may be, e.g., a proportional valve, a modulating valve, a needle valve, a pressure regulator, a mass flow controller, combinations of these, or the like. However, any suitable method for controlling and regulating the flow may be utilized, and all such components and methods are fully intended to be included within the scope of the embodiments.

The planarization chamber 219 may receive the desired oxidation solution and expose the surface of the substrate 50 to the oxidation solution. The planarization chamber 219 may be any desired shape that may be suitable for dispersing the oxidation solution and contacting the oxidation solution with the dummy gate layer 62. In the embodiment illustrated, the planarization chamber 219 has a cylindrical sidewall and a bottom. However, the planarization chamber 219 is not limited to a cylindrical shape, and any other suitable shape, such as a hollow square tube, an octagonal shape, or the like, may be utilized. Furthermore, the planarization chamber 219 may be surrounded by a housing 233 made of material that is inert to the oxidation solution. As such, while the housing 233 may be any suitable material that can withstand the chemistries involved in the planarization process, in an embodiment the housing 233 may be steel, stainless steel, nickel, aluminum, alloys of these, combinations of these, and like, and may be covered with a plastic shield. In some embodiments, metal parts of the housing 233 are coated with a polymer.

The planarization chamber 219 may also have an outlet 237 for exhaust liquids and gases to exit the planarization chamber 219. A pump 239 may be connected to the outlet 237 of the planarization chamber 219 in order to help evacuate the processing materials. The pump 239, under control of the control unit 227, may also be utilized to evacuate oxidation solution from the planarization chamber 219, in preparation for the introduction of the next oxidation solution. In some embodiments, the oxidation solution may be purged with a spin-off operation. For example, the oxidation solution may be spun off, the substrate 50 may be rinsed with water, and the water may then be spun off. The waste water and oxidation solution may be evacuated through the outlet 237.

In FIG. 8C, the self-limiting oxide process is performed in the first step of the planarization, thereby oxidizing the surface of the substrate 50 such that some of the surface of the dummy gate layer 62 is converted to a modified surface layer 62S. In FIG. 8A, the modified surface layer 62S is an oxide of the dummy gate layer 62, and is formed by increasing the oxygen concentration of the top surface of the dummy gate layer 62.

The self-limiting oxidation process is performed by dispensing the oxidation solution on the surface of the dummy gate layer 62. In some embodiments, the oxidation solution is formed by oxidation reactants that include water and $H_2O_2$. The $H_2O_2$ may be diluted to a concentration of about 5% of the oxidation solution. In some embodiments, the oxidation solution is ozonated water, e.g., water that ozone has been dissolved in. The oxidation solution may be formed by oxidation reactants that include water and ozone, and the ozone may be dissolved in the water such that the ozone concentration is about 30 ppm. In some embodiments, the oxidation solution includes $Fe(NO_3)_3$ (e.g., ferric nitrate). The oxidation reactant delivery systems 211 supply the oxidation reactants to the flow controller 223. The flow controller 223 may be utilized to control the flow of the oxidation reactants to an oxidation reactant controller 224 and, eventually, to the planarization chamber 219 via the slurry dispenser 205. One or more of the oxidation reactant delivery systems 211 may supply their individual oxidation reactants into the oxidation reactant controller 224. The oxidation reactant controller 224 connects and isolates the respective oxidation reactant delivery systems to and from the planarization chamber 219, in order to deliver the desired oxidation reactants to the slurry dispenser 205. The oxidation reactant controller 224 may include devices such as valves, flow meters, sensors, and the like to control the delivery rates of each of the oxidation reactants, and may be controlled by instructions received from a control unit 227 (described further below with respect to FIG. 8B). The oxidation reactant controller 224, upon receiving instructions from the control unit 227, may open and close valves so as to connect one or more of the oxidation reactant delivery systems 211 to the planarization chamber 219 and direct a desired oxidation solution through the slurry dispenser 205. The oxidation solution may be delivered by the oxidation reactant controller 224 at a flow rate of from about 20 sccm to about 300 sccm, such as about 100 sccm. The desired oxidation solution may therefore be applied to the substrate 50. In an embodiment, the oxidation solution is applied to the substrate 50 before the removal aspect (e.g., the grinding) of the CMP is performed.

The self-limiting oxide process may be performed until oxidization of the dummy gate layer 62 is saturated, e.g., until the formation rate of the modified surface layer 62S substantially decreases or stops. Saturation may occur, for example, after a predetermined amount of time elapses, such as from about 1 second to about 30 seconds, such as about 3 seconds. Saturation may also occur, for example, after the modified surface layer 62S is formed to a predetermined thickness $T_1$, such as a thickness of from about 2 Å to about 50 Å, such as about 10 Å. In an embodiment, the thickness $T_1$ is as small as a monolayer. As noted above, the oxide process shown in FIG. 8C is performed before mechanical forces are applied to the dummy gate layer 62. After the self-limiting oxide process completes, and before the modified surface layer 62S is removed, the oxidation solution may be removed with a rinsing and spin-off operation, as described above.

In FIG. 8D, once delivery of the oxidation solution has been stopped, the removal process is performed in the second step of the planarization, thereby removing the modified surface layer 62S from the top surface of the dummy gate layer 62. The removal process may include grinding the dummy gate layer 62 with the platen 203. The platen 203 may, e.g., be rotatably applied to the substrate 50 in order to mechanically grind and remove the modified surface layer 62S. During the removal process, substantially no further oxidation of the dummy gate layer 62 occurs. As such, the modified surface layer 62S may not increase in thickness during removal. The platen 203 may be applied with the same amount of downward pressure and rotation speed as an oxide CMP. For example, the platen 203 may be applied with a downward pressure of about 2 psi, and the platen 203 may be rotated at about 100 RPM.

In order to assist in the removal process, CMP slurry 207 may additionally be added to the grinding process of the platen 203 through the slurry dispenser 205. The CMP slurry 207 may be provided by one or more slurry delivery systems 213. The slurry delivery systems 213 provide individual chemical components that are mixed to produce the CMP slurry 207. For example, the slurry delivery systems 213 may provide etchants, abrasives, and the like, to produce an abrasive solution. The CMP slurry 207 may be different from the oxidation solution delivered to the dummy gate layer 62 through the slurry dispenser 205. The CMP slurry 207 may also include rate inhibitors. The rate inhibitors may protect materials underlying the modified surface layer 62S. The rate inhibitors increase the removal rate difference between the modified surface layer 62S and underlying materials (e.g., unmodified portions of the dummy gate layer 62), and selection of the rate inhibitors depends on the material being altered. In an embodiment the CMP slurry 207 may comprise abrasives such as silica, alumina and ceria which will work in conjunction with the platen 203 to grind and remove the oxide layer. Because, as noted above, substantially no oxidation of the dummy gate layer 62 occurs during the removal process, the CMP slurry 207 may be substantially free of oxidants. After the removal of the oxidation layer, the thickness of the dummy gate layer 62 may decrease by the thickness $T_1$. In some embodiments, the CMP slurry 207 may not be added to the grinding process. The modified surface layer 62S may be sufficiently weak that mechanical contact with the platen 203 is sufficient to remove the modified surface layer 62S.

Once the oxide layer is removed from the substrate 50, the planarization chamber 219 may be evacuated with a rinsing and spin-off operation, as described above. The oxide formation and removal steps may then be repeated, with a purge between each removal, until a desired amount of material is removed from the top surface of the dummy gate layer 62.

Although the planarization process discussed above with respect to FIGS. 8A, 8B, 8C, and 8D uses a self-limiting oxidation process with an oxidation solution, other embodiments may form the modified surface layer 62S through other means. In some embodiments, the oxidation may be accomplished by dispensing a gas, such as $O_3$, over the substrate 50 with a showerhead. In some embodiments, a chemical bonding process may be used to introduce ligands or chelators that occupy surface molecules of the substrate 50, thereby forming a modified surface layer that may be removed by the mechanical processes.

In embodiments where the self-limiting process is a chemical bonding process, the ligands are dispensed on the substrate 50 in a liquid form. In such embodiments, the ligands occupy surface bonds of the top surface of the wafer or substrate 50. The ligands bind to the surface, modifying it, and thereby forming the modified surface layer 62S. The ligands may be dispensed in a similar manner as the oxidation solution, e.g., through the slurry dispenser 205. The ligands may be formed from some of the individual chemical components that make up the CMP slurry 207, such as those delivered by the slurry delivery systems 213. In such embodiments, the CMP slurry 207 may be supplied to the planarization process as individual chemical components, instead of a premixed slurry, and the ligands may be selected from those chemical components and dispensed in pulses that bind to the wafer surface during the self-limiting process. The individual chemical components may be adjusted or selected to adjust the amount that the wafer surface is modified.

Further although the planarization process discussed above with respect to FIGS. 8A, 8B, 8C, and 8D is described as performing multiple pulses or cycles of oxidation and removal in the same planarization chamber 219, it should be appreciated that more than one planarization chamber 219 may be used. For example, two planarization chambers 219 may be used, where a first planarization chamber 219 is used for dispensing the oxidation solution on the substrate 50 to form the modified surface layer 62S, and a second planarization chamber 219 is used for removing the modified surface layer 62S.

FIG. 8B illustrates an embodiment of the control unit 227 that may be utilized to control the oxidation reactant controller 224 and the pump 239 (as illustrated in FIG. 8A). Control signals of the control unit 227 are illustrated with dashed lines. The control unit 227 may be any form of computer processor that can be used in an industrial setting for controlling process machines. In an embodiment, the control unit 227 comprises a processing unit 251, such as a desktop computer, a workstation, a laptop computer, or a dedicated unit customized for a particular application. The control unit 227 may be equipped with a display 253 and one or more input/output components 255, such as instruction outputs, sensor inputs, a mouse, a keyboard, printer, combinations of these, or the like. The processing unit 251 may include a central processing unit (CPU) 257, memory 259, a mass storage device 261, a video adapter 263, and an I/O interface 265 connected to a bus 267.

The bus 267 may be one or more of any type of several bus architectures including a memory bus or memory controller, a peripheral bus, or video bus. The CPU 257 may comprise any type of electronic data processor, and the memory 259 may comprise any type of system memory, such as static random access memory (SRAM), dynamic random access memory (DRAM), or read-only memory (ROM). The mass storage device 261 may comprise any type of storage device configured to store data, programs, and other information and to make the data, programs, and other information accessible via the bus 267. The mass storage device 261 may comprise, for example, one or more of a hard disk drive, a magnetic disk drive, or an optical disk drive.

The video adapter 263 and the I/O interface 265 provide interfaces to couple external input and output devices to the processing unit 251. As illustrated in FIG. 8B, examples of input and output devices include the display 253 coupled to the video adapter 263 and the I/O component 255, such as a mouse, keyboard, printer, and the like, coupled to the I/O interface 265. Other devices may be coupled to the processing unit 251, and additional or fewer interface cards may be utilized. For example, a serial interface card (not shown) may be used to provide a serial interface for a printer. The processing unit 251 also may include a network interface 269 that may be a wired link to a local area network (LAN) or a wide area network (WAN) 271 and/or a wireless link.

It should be noted that the control unit 227 may include other components. For example, the control unit 227 may include power supplies, cables, a motherboard, removable storage media, cases, and the like. These other components, although not shown in FIG. 8B, are considered part of the control unit 227.

Although the planarization system 200 is shown as being used to planarize the dummy gate layer 62, it should be appreciated that ALR with the planarization system 200 could be performed to planarize a wide variety of materials. For example, in embodiments where a dielectric is to be planarized, such as the planarizing of the insulation material 54, ALR could be used, and the self-limiting process may be a chemical bonding process.

Figure 8E:
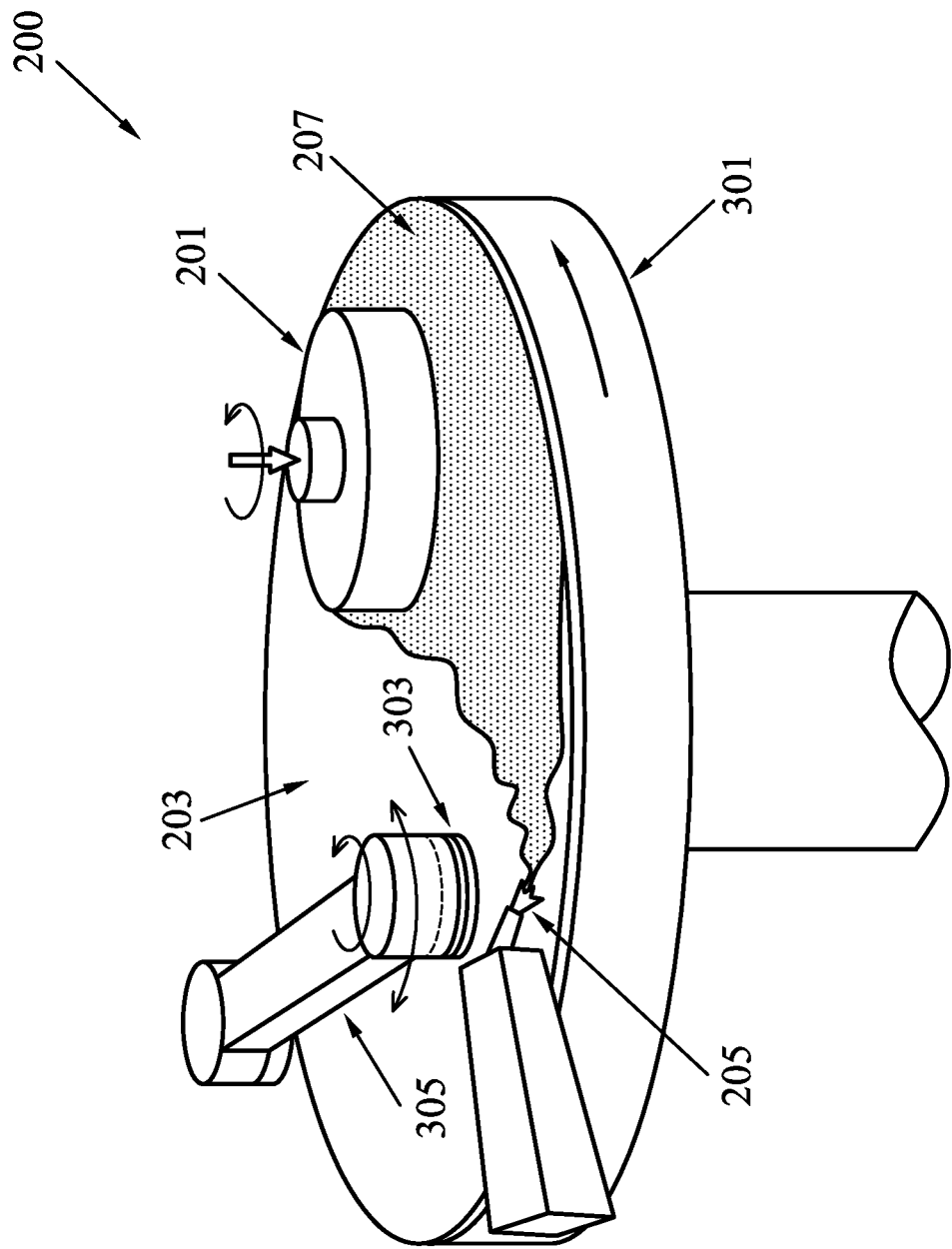
FIG. 8E illustrates aspects of a planarization system, according to some other embodiments.

Further, although the planarization system 200 is shown as being an orbital polishing planarization system, it should be appreciated that embodiments may be applied in other types of planarization systems. For example, FIG. 8E illustrates aspects of the planarization system 200, according to some other embodiments. In the embodiment of FIG. 8E, the wafer carrier 201 is a polishing head, and the substrate 50 is fixed in the polishing head such that it faces the platen 203 in a downward direction. A chuck 301 having the platen 203 thereon is rotated. The wafer carrier 201 rotates the substrate 50 and provides downward forces that cause the substrate 50 to be pressed against the platen 203 (including the polishing pad) as the substrate 50 and platen 203 rotate. The CMP slurry 207 is dispensed on the platen 203 by the slurry dispenser 205. During operation, a pad conditioner 303 is swept across the platen 203 to increase surface roughness of the polishing pad and remove used CMP slurry 207. The pad conditioner 303 may be, e.g., a stainless steel plate that is coated with abrasives such as nickel-plated diamond grits, a diamond film, or the like. An arm 305 secures and moves the pad conditioner 303 during operation. In the embodiment shown in FIG. 8E, the self-limiting process may be performed by dispensing the oxidation solution on the platen 203 with the slurry dispenser 205. The substrate 50 may be exposed to the oxidation solution on the platen 203 when downward forces are not applied by the wafer carrier 201 (e.g., polishing head). In some embodiments, the polishing head and chuck 301 may not be rotated during the self-limiting process. After the self-limiting process completes, the substrate 50 is cleaned of the oxidation solution. The CMP slurry 207 is then dispensed and the substrate 50 is polished by rotating the polishing head and chuck 301 while applying downward forces with the polishing head.

Figure 9:
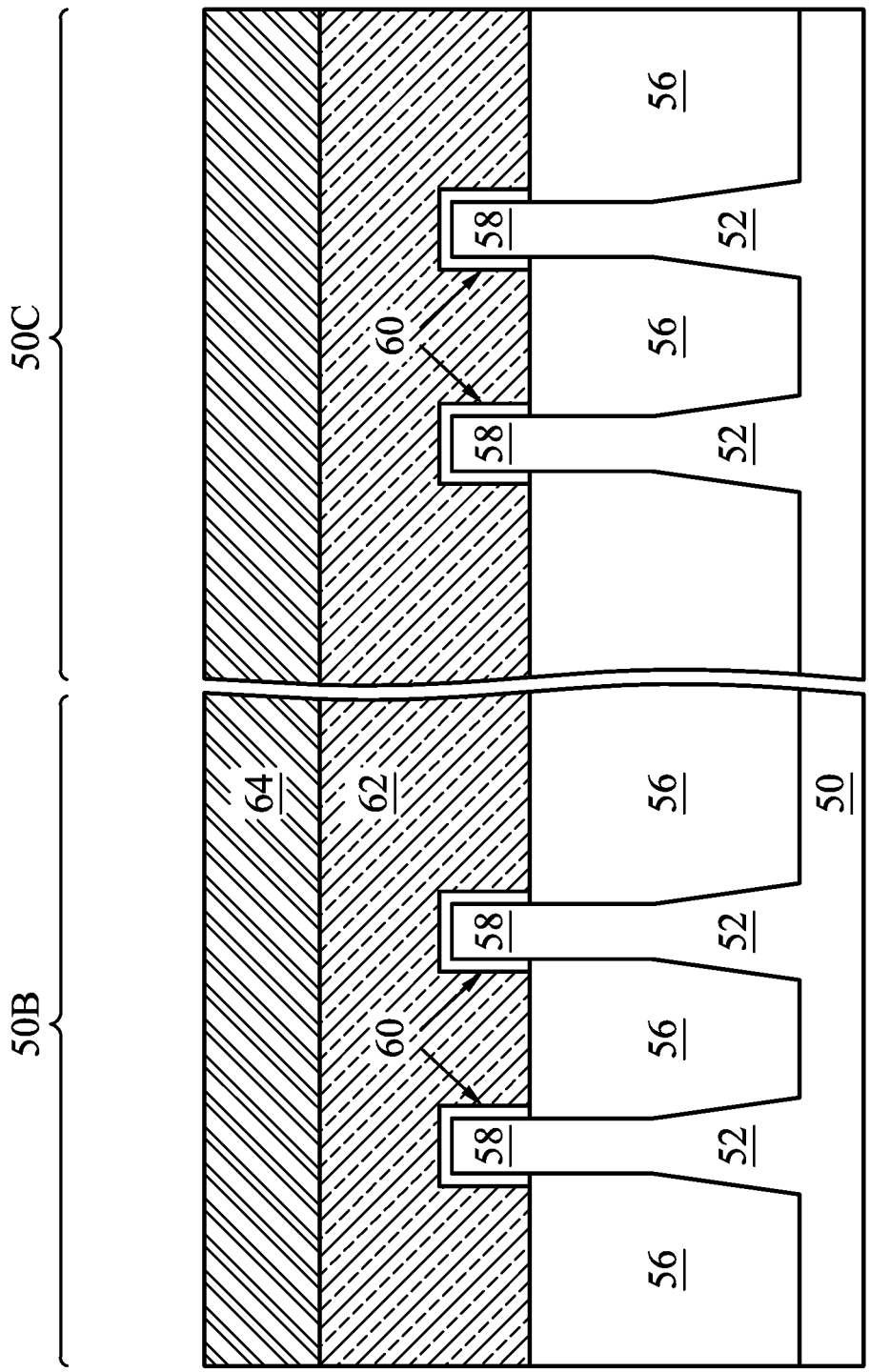
FIGS. 9, 10A, 10B, 11A, 11B, 12A, 12B, 13A, 13B, 14A, 14B, 15A, 15B, 16A, 16B, 17A, 17B, 18A, and 18B are cross-sectional views of intermediate stages in the manufacturing of FinFETs, according to some embodiments.

In FIG. 9, a mask layer 64 is formed over the dummy gate layer 62. The mask layer 64 may be deposited over the dummy gate layer 62. The mask layer 64 may include, for example, SiN, SiON, or the like. In the example shown, a single dummy gate layer 62 and a single mask layer 64 are formed across the first region 50B and the second region 50C. In some embodiments, separate dummy gate layers may be formed in the first region 50B and the second region 50C, and separate mask layers may be formed in the first region 50B and the second region 50C.

Figure 10B:
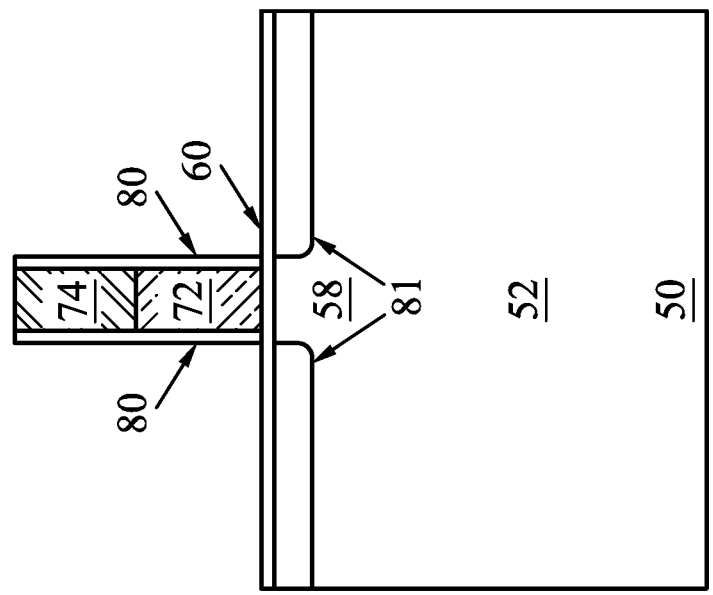
Figure 10A:
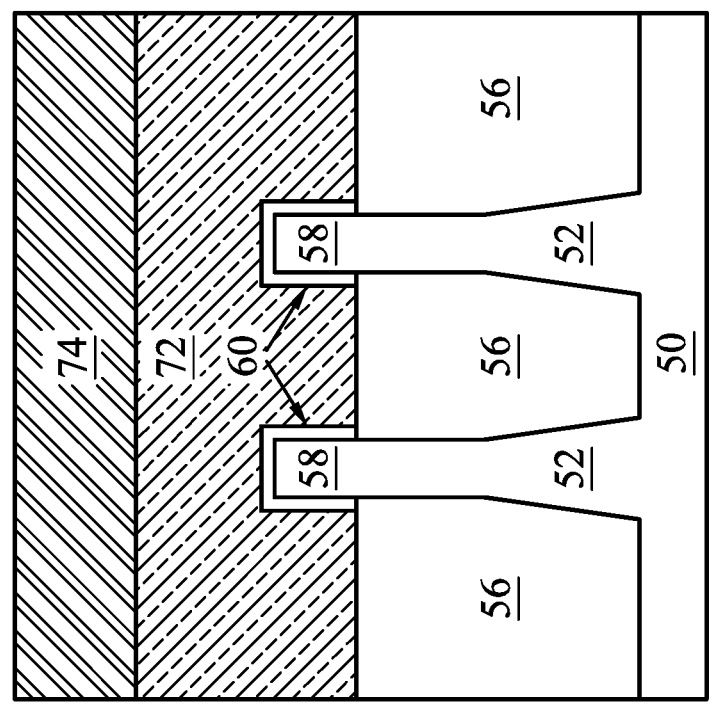

In FIGS. 10A and 10B, the mask layer 64 may be patterned using acceptable photolithography and etching techniques to form masks 74. The pattern of the masks 74 then may be transferred to the dummy gate layer 62 and the dummy dielectric layer 60 by an acceptable etching technique to form dummy gates 72. The dummy gates 72 cover respective channel regions of the fins 58. The dummy gates 72 may also have a lengthwise direction substantially perpendicular to the lengthwise direction of respective epitaxial fins.

Further in FIGS. 10A and 10B, gate seal spacers 80 can be formed on exposed surfaces of the dummy gates 72, the masks 74, and/or the fins 58. A thermal oxidation or a deposition followed by an anisotropic etch may form the gate seal spacers 80. After the formation of the gate seal spacers 80, implants for lightly doped source/drain (LDD) regions 81 may be performed. An anneal may be used to activate the implanted impurities.

Figure 11B:
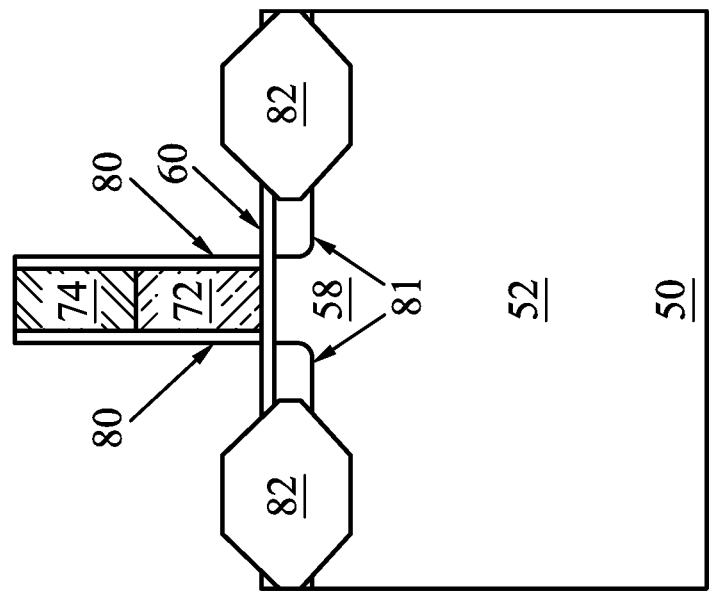
Figure 11A:
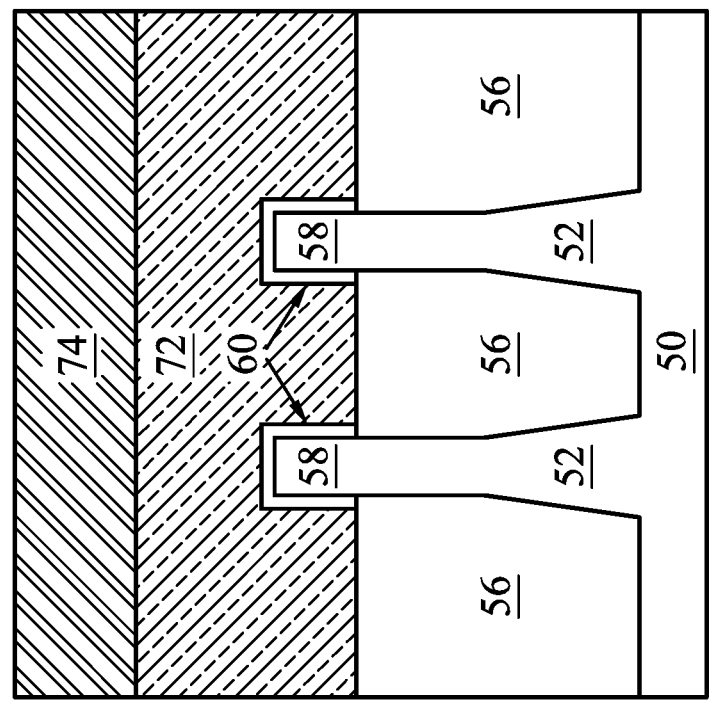

In FIGS. 11A and 11B epitaxial source/drain regions 82 are formed in the fins 58. The epitaxial source/drain regions 82 are formed in the fins 58 such that each dummy gate 72 is disposed between respective neighboring pairs of the epitaxial source/drain regions 82. In some embodiments that epitaxial source/drain regions 82 may extend into the fins 52. The epitaxial source/drain regions 82 may be formed by masking the first region 50B, recessing the fins 58 in the second region 50C, epitaxially growing the epitaxial source/drain regions 82 in the recesses, and removing the mask. The second region 50C may be masked, and the process repeated for the first region 50B.

Figure 12B:
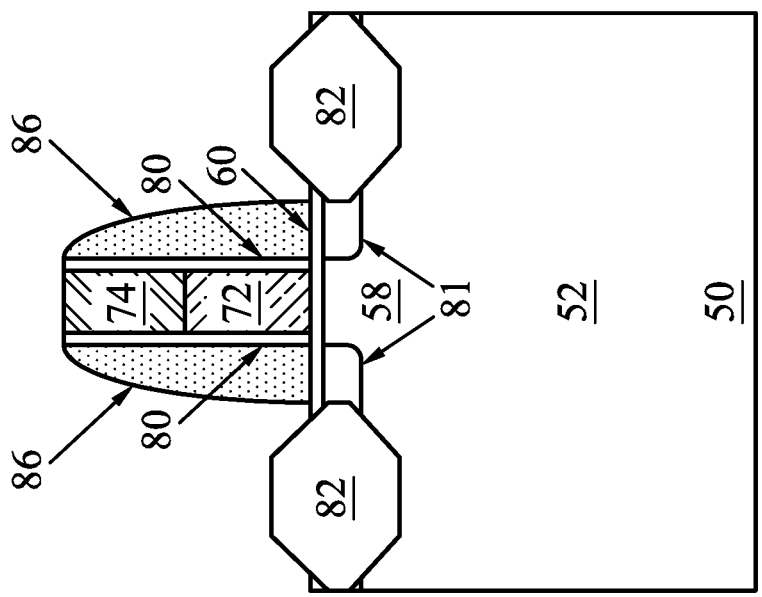
Figure 12A:
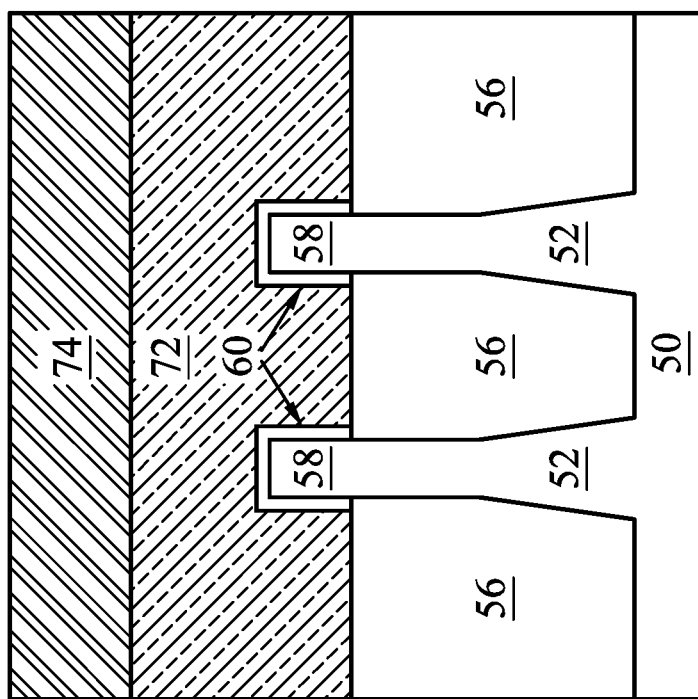

In FIGS. 12A and 12B, gate spacers 86 are formed on the gate seal spacers 80 along sidewalls of the dummy gates 72 and the masks 74. The gate spacers 86 may be formed by conformally depositing a material and subsequently anisotropically etching the material. The material of the gate spacers 86 may be silicon nitride, SiCN, a combination thereof, or the like.

The epitaxial source/drain regions 82 and/or the epitaxial fins may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 13B:
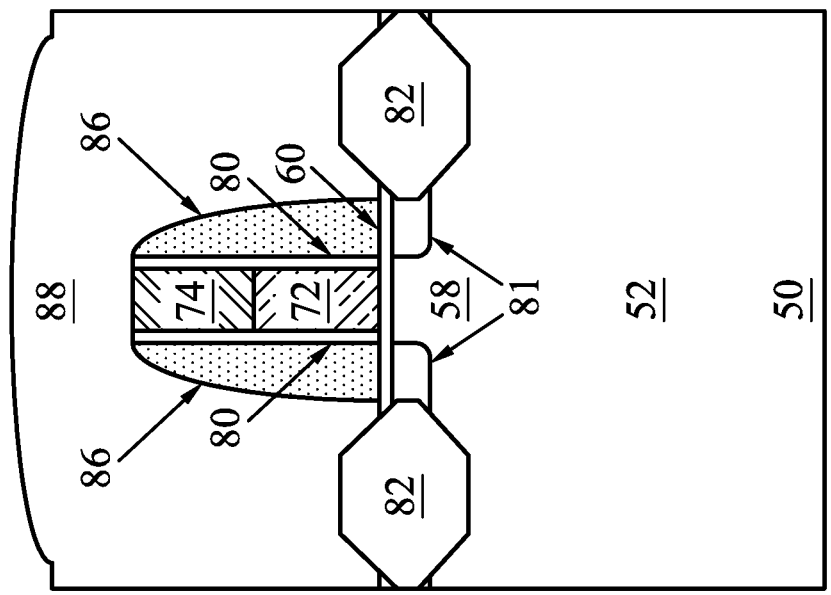
Figure 13A:
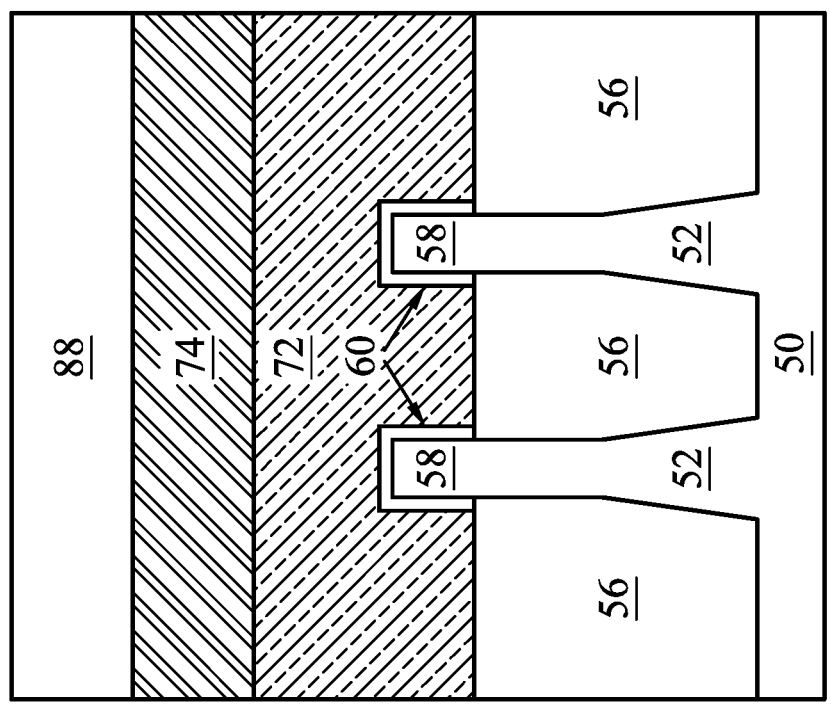

In FIGS. 13A and 13B, an ILD 88 is deposited over the substrate 50. The ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation or semiconductor materials formed by any acceptable process may be used.

Figure 14A:
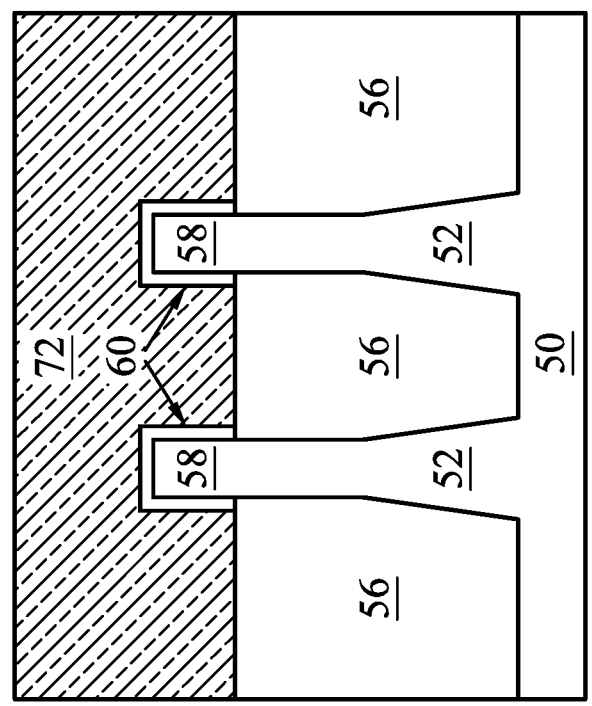
Figure 14B:
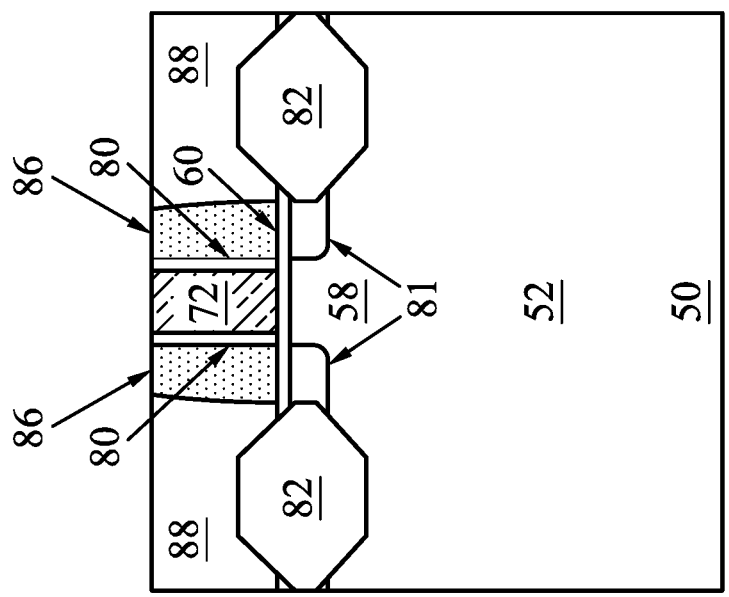

In FIGS. 14A and 14B, a planarization process, such as a CMP, may be performed to level the top surface of the ILD 88 with the top surfaces of the dummy gates 72. In an embodiment, the planarization process is an ALR process performed using the planarization system 200. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the ILD 88 are level. Accordingly, the top surfaces of the dummy gates 72 are exposed through the ILD 88.

Figure 15B:
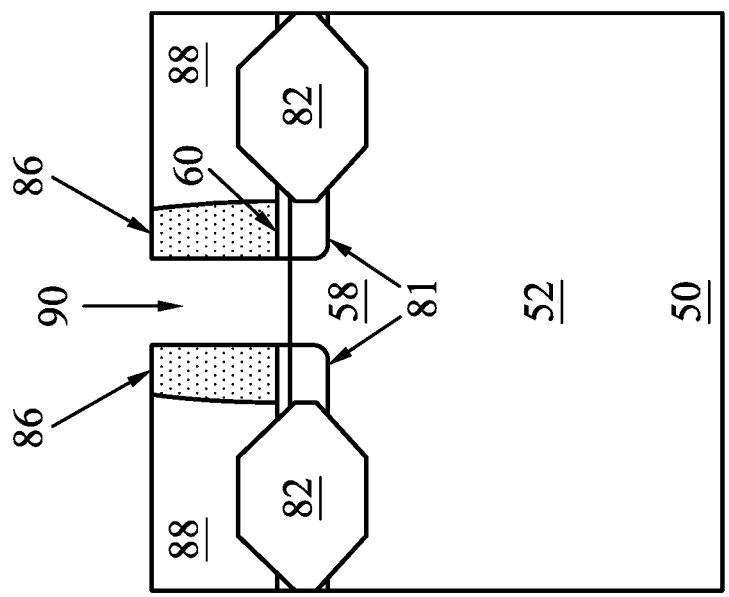
Figure 15A:
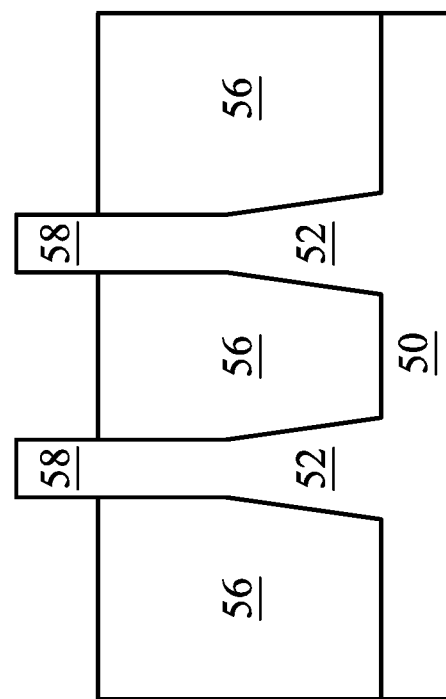

In FIGS. 15A and 15B, the exposed portions of the dummy gates 72, the gate seal spacers 80, and portions of the dummy dielectric layer 60 directly underlying the exposed dummy gates 72 are removed in an etching step(s), so that recesses 90 are formed. In some embodiments, the dummy gates 72 are removed by an anisotropic dry etch process. For example, the etching process may include a dry etch process using reaction gas(es) that selectively etch the dummy gates 72 without etching the ILD 88 or the gate spacers 86. Each recess 90 exposes a channel region of a respective fin 58. Each channel region is disposed between neighboring pairs of the epitaxial source/drain regions 82. During the removal, the dummy dielectric layer 60 may be used as an etch stop layer when the dummy gates 72 are etched. The dummy dielectric layer 60 and the gate seal spacers 80 may then be removed after the removal of the dummy gates 72.

Figure 16B:
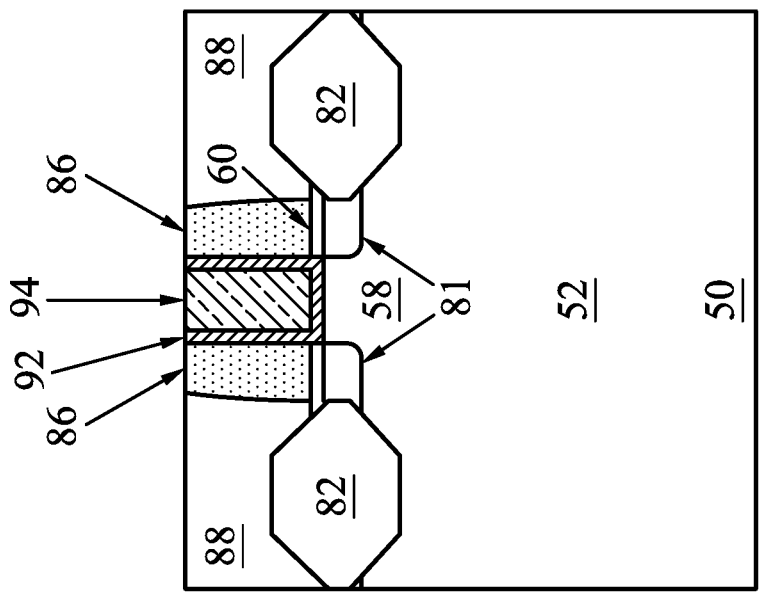
Figure 16A:
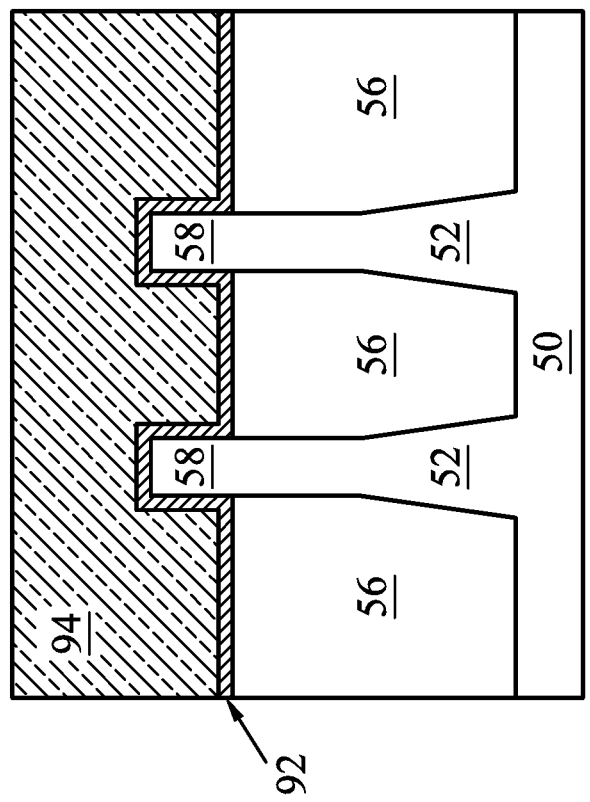

In FIGS. 16A and 16B, gate dielectric layers 92 and gate electrodes 94 are formed for replacement gates. Gate dielectric layers 92 are deposited conformally in the recesses 90, such as on the top surfaces and the sidewalls of the fins 58 and on sidewalls of the gate spacers 86, and on a top surface of the ILD 88. According to some embodiments, the gate dielectric layers 92 are silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like.

The gate electrodes 94 are deposited over the gate dielectric layers 92, respectively, and fill the remaining portions of the recesses 90. The gate electrodes 94 may be a metal-containing material such as TiN, TaN, TaC, Co, W, Ru, Al, combinations thereof, or multi-layers thereof. After the filling of the gate electrodes 94, a planarization process, such as a CMP, may be performed to remove the excess portions of the gate dielectric layers 92 and the material of the gate electrodes 94, which excess portions are over the top surface of the ILD 88. In an embodiment, the planarization process is an ALR process performed using the planarization system 200. The resulting remaining portions of material of the gate electrodes 94 and the gate dielectric layers 92 thus form replacement gates of the resulting FinFETs. The gate electrodes 94 and the gate dielectric layers 92 may be collectively referred to as a "gate" or a "gate stack."

The formation of the gate dielectric layers 92 in the first region 50B and the second region 50C may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 17B:
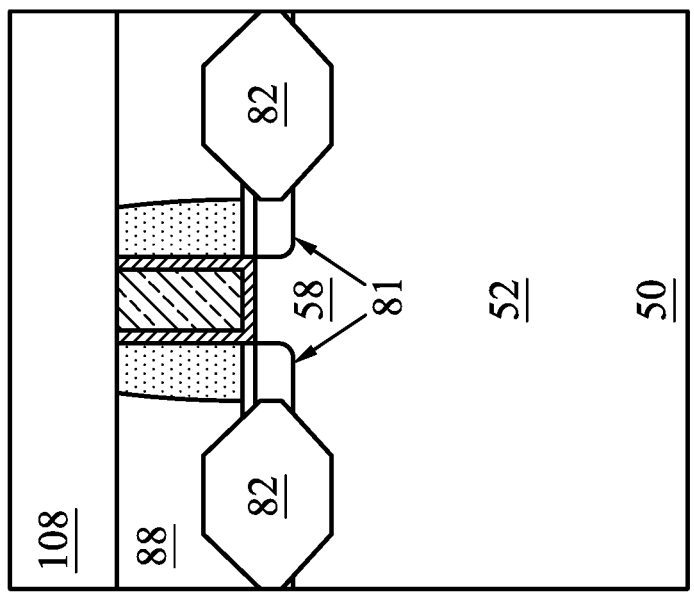
Figure 17A:
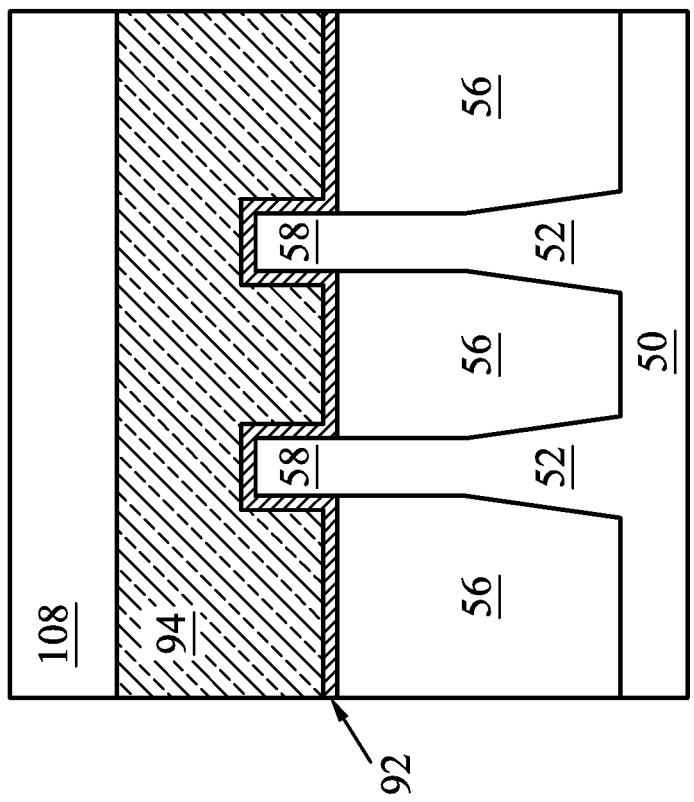

In FIGS. 17A and 17B, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD. Because various embodiments allow use of a planarization stop layer to be avoided, the ILD 108 may physically contact the ILD 88.

Figure 18B:
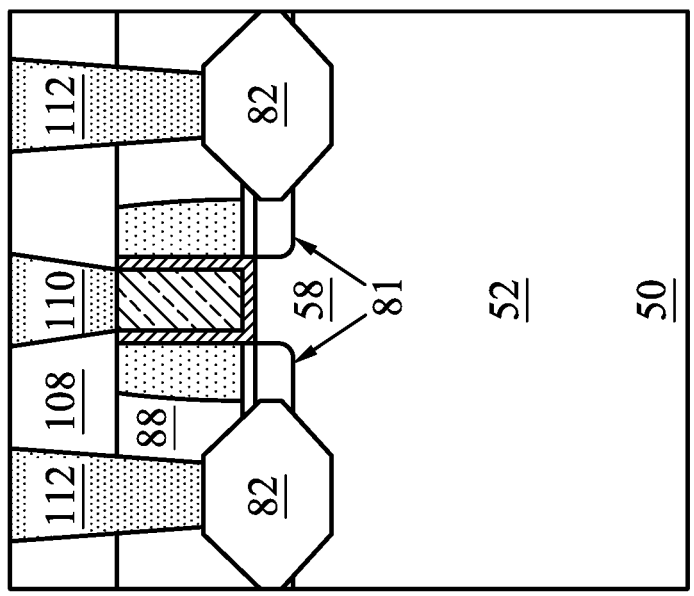
Figure 18A:
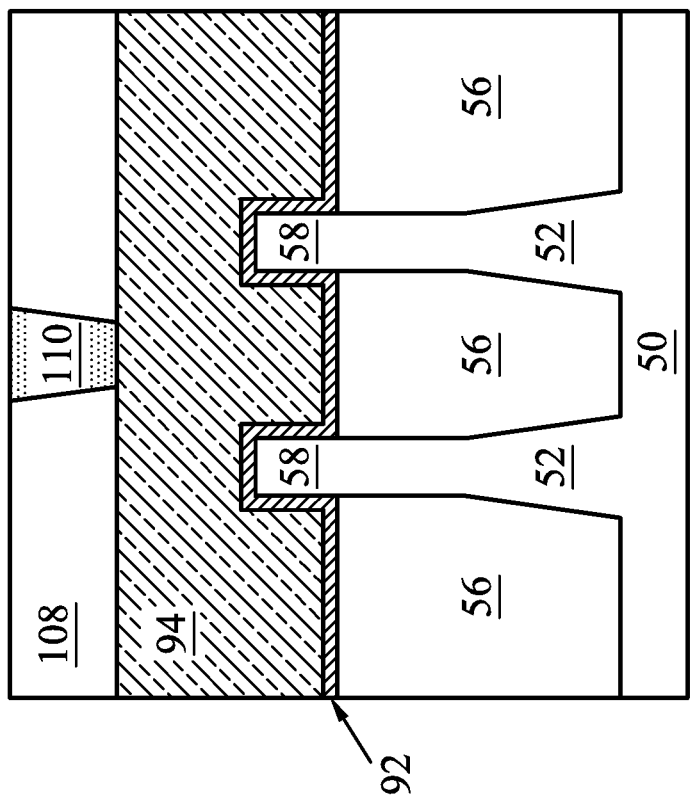

In FIGS. 18A and 18B, contacts 110 and 112 are formed through the ILD 108 and the ILD 88. Openings for the contacts 110 and 112 are formed through the ILD 108 and the ILD 88. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 108. In an embodiment, the planarization process is an ALR process performed using the planarization system 200. The remaining liner and conductive material form the contacts 110 and 112 in the openings. An anneal process may be performed to form a silicide at the interface between the epitaxial source/drain regions 82 and the contacts 112. The contact 110 is physically and electrically connected to the gate electrode 94, and the contacts 112 are physically and electrically connected to the epitaxial source/drain regions 82.

Embodiments may achieve advantages. Oxidizing a surface of the wafer, such as the dummy gate layer 62, may allow a self-limiting process to be employed during planarization. As such, the thickness of the material removed by the planarization may be controlled such that a predetermined amount of material may be removed without the use of stop layers. Further, the time and material costs associated with some techniques used to rework variances in planarization rates may be avoided.

In an embodiment, a method includes: performing a self-limiting process to modify a top surface of a wafer; after the self-limiting process completes, removing the modified top surface from the wafer; and repeating the performing the self-limiting process and the removing the modified top surface from the wafer until a thickness of the wafer is decreased to a predetermined thickness.

In some embodiments, the self-limiting process occupies surface bonds of the top surface of the wafer with ligand molecules. In some embodiments, the self-limiting process is an oxidation process. In some embodiments, the oxidation process includes exposing the top surface of the wafer to $O_3$. In some embodiments, the $O_3$ is dispensed with a slurry dispenser. In some embodiments, the oxidation process includes dispensing an oxidation solution on the top surface of the wafer, the oxidation solution including $H_2O_2$ or $Fe(NO_3)_3$. In some embodiments, the $H_2O_2$ is dispensed with a slurry dispenser. In some embodiments, a slurry is dispensed on the wafer with the slurry dispenser during the removing the modified top surface from the wafer. In some embodiments, a plurality of chemicals are connected to the slurry dispenser, and the dispensing the $H_2O_2$ includes selecting one or more of the chemicals and dispensing the selected chemicals with the slurry dispenser. In some embodiments, no further modification of the top surface of the wafer is performed during the removing the modified top surface from the wafer.

In an embodiment, a method includes: forming fins on a substrate; forming a dummy gate material over the fins; oxidizing a top surface of the dummy gate material to form an oxide layer in the top surface of the dummy gate material, the oxidizing performed until a predefined amount of time elapses; after the oxidizing the top surface of the dummy gate material, removing the oxide layer from the dummy gate material; patterning the dummy gate material to form a dummy gate; forming gate spacers along sides of the dummy gate; and replacing the dummy gate with a replacement gate dielectric and a replacement gate electrode.

In some embodiments, the top surface of the dummy gate material is oxidized with a self-limiting process, and substantially no oxidizing of the dummy gate material is performed during the removing the oxide layer. In some embodiments, the oxidizing the top surface of the dummy gate material is performed for a timespan of from about 1 second to 30 seconds. In some embodiments, the oxidizing the top surface of the dummy gate material is performed until the thickness of the oxide layer is from about 2 to 50. In some embodiments, the removing the oxide layer from the dummy gate material includes: dispensing a slurry on the top surface of the dummy gate material; and grinding the top surface of the dummy gate material while dispensing the slurry. In some embodiments, the slurry is dispensed through a slurry dispenser, and the oxidizing the top surface of the dummy gate material includes dispensing $H_2O_2$ with the slurry dispenser.

In an embodiment, a method includes: mixing a first subset of a plurality of chemicals to produce an oxidation solution; dispensing the oxidation solution on a top surface of a wafer; stopping the dispensing of the oxidation solution; after the stopping the dispensing of the oxidation solution, mixing a second subset of the plurality of chemicals to produce an abrasive solution; and dispensing the abrasive solution on the top surface of the wafer while grinding the top surface of the wafer.

In some embodiments, the oxidation solution converts the top surface of the wafer to an oxidized layer, and the dispensing of the oxidation solution is stopped after a thickness of the oxide layer stops increasing. In some embodiments, the method further includes: before the mixing a second subset of the plurality of chemicals to produce an abrasive solution, rinsing the oxidation solution from the top surface of a wafer. In some embodiments, the abrasive solution includes one or more of silica, alumina, or ceria, the abrasive solution further includes rate inhibitors, and the abrasive solution is free of oxidation reactants.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming fins on a substrate;
   forming a dummy gate layer over the fins;
   performing a self-limiting oxidation process on a top surface of the dummy gate layer to form an oxide layer in the top surface of the dummy gate layer, the self-limiting oxidation process performed until a thickness of the oxide layer stops increasing;
   after performing the self-limiting oxidation process, performing a grinding process to remove the oxide layer from the dummy gate layer, wherein no oxidizing of the dummy gate layer is performed during the grinding process;
   patterning the dummy gate layer to form a dummy gate;
   forming gate spacers along sides of the dummy gate; and
   replacing the dummy gate with a replacement gate dielectric and a replacement gate electrode.

2. The method of claim 1, wherein the self-limiting oxidation process is performed for a timespan of from 1 second to 3o seconds.

3. The method of claim 1, wherein the self-limiting oxidation process is performed until the thickness of the oxide layer is from 2 Å to 50 Å.

4. The method of claim 1, wherein the self-limiting oxidation process is performed until the thickness of the oxide layer is a monolayer.

5. The method of claim 1, wherein the grinding process comprises:
dispensing a slurry on the top surface of the dummy gate layer; and
grinding the top surface of the dummy gate layer while dispensing the slurry.

6. The method of claim 5, wherein the slurry is dispensed through a slurry dispenser, and wherein the self-limiting oxidation process comprises dispensing an oxidation solution with the slurry dispenser.

7. The method of claim 6, wherein the oxidation solution comprises $H_2O_2$ or $Fe(NO_3)_3$.

8. A method comprising:
forming a dummy gate layer over a fin;
dispensing an oxidation solution on a top surface of the dummy gate layer, the oxidation solution comprising oxidation reactants;
after dispensing the oxidation solution, dispensing an abrasive solution on the top surface of the dummy gate layer, the abrasive solution free of the oxidation reactants;
grinding the top surface of the dummy gate layer while dispensing the abrasive solution; and
patterning the dummy gate layer to form a gate structure over a channel region for a transistor.

9. The method of claim 8, wherein the dummy gate layer comprises polysilicon.

10. The method of claim 8, wherein the oxidation solution comprises $H_2O_2$ or $Fe(NO_3)_3$.

11. The method of claim 8, wherein the abrasive solution comprises an abrasive and a rate inhibitor.

12. The method of claim 8 further comprising:
removing the oxidation solution from the top surface of the dummy gate layer after oxidation of the dummy gate layer stops.

13. The method of claim 12, wherein oxidation of the dummy gate layer stops after one monolayer of the top surface of the dummy gate layer is oxidized.

14. The method of claim 12, wherein oxidation of the dummy gate layer stops after from 2 Å to 50 Å of the top surface of the dummy gate layer is oxidized.

15. The method of claim 8, wherein the oxidation solution and the abrasive solution are dispensed with a same dispenser.

16. A method comprising:
forming fins on a substrate;
forming a dummy gate layer over the fins;
planarizing a top surface of the dummy gate layer, the planarizing comprising repeatedly:
modifying the top surface of the dummy gate layer with a self-limiting process, wherein no grinding of the dummy gate layer is performed during the self-limiting process; and
removing the modified top surface of the dummy gate layer with a grinding process;
after planarizing the top surface of the dummy gate layer, patterning the dummy gate layer to form a dummy gate;
forming gate spacers along sides of the dummy gate; and
replacing the dummy gate with a replacement gate.

17. The method of claim 16, wherein the self-limiting process is an oxidation process.

18. The method of claim 16, wherein the self-limiting process is a chemical bonding process.

19. The method of claim 16, wherein the self-limiting process modifies a monolayer of the top surface of the dummy gate layer.

20. The method of claim 16, wherein the self-limiting process modifies a plurality of monolayers of the top surface of the dummy gate layer.

* * * * *

UNITED STATES PATENT AND TRADEMARK OFFICE
CERTIFICATE OF CORRECTION

PATENT NO. : 11,621,342 B2
APPLICATION NO. : 17/068578
DATED : April 4, 2023
INVENTOR(S) : Chih Hung Chen It is certified that error appears in the above-identified patent and that said Letters Patent is hereby corrected as shown below:

In the Claims

Claim 2, Column 14, Line 64; delete "3o" and insert --30--.

Signed and Sealed this
Ninth Day of May, 2023

Katherine Kelly Vidal
*Director of the United States Patent and Trademark Office*